(12) United States Patent
Harney et al.

(10) Patent No.: US 10,045,121 B2
(45) Date of Patent: Aug. 7, 2018

(54) MICROELECTROMECHANICAL SYSTEMS (MEMS) MICROPHONE BIAS VOLTAGE

(71) Applicant: INVENSENSE, INC., San Jose, CA (US)

(72) Inventors: Kieran Harney, Andover, MA (US); Adrianus Maria Lafort, Delft (NL); Brian Moss, Limerick (IE); Dion Ivo De Roo, Voorburg (NL)

(73) Assignee: Invensense, Inc., San Jose, CA (US)

( * ) Notice: Subject to any disclaimer, the term of this patent is extended or adjusted under 35 U.S.C. 154(b) by 119 days.

(21) Appl. No.: 15/142,696

(22) Filed: Apr. 29, 2016

(65) Prior Publication Data

US 2017/0318385 A1 Nov. 2, 2017

(51) Int. Cl.
*H04R 3/00* (2006.01)
*H02M 3/07* (2006.01)
*H03F 3/183* (2006.01)
*H03F 3/45* (2006.01)
*H04R 19/00* (2006.01)
*H04R 19/04* (2006.01)
*B81B 7/00* (2006.01)
*H04R 3/04* (2006.01)

(52) U.S. Cl.
CPC ............... *H04R 3/00* (2013.01); *B81B 7/008* (2013.01); *H02M 3/07* (2013.01); *H03F 3/183* (2013.01); *H03F 3/45071* (2013.01); *H04R 3/04* (2013.01); *H04R 19/005* (2013.01); *H04R 19/04* (2013.01); *H03F 2200/03* (2013.01); *H04R 2201/003* (2013.01)

(58) Field of Classification Search
CPC ............... H03F 3/187; H03F 2200/504; H03F 2200/516; H04R 3/00; H03G 3/004
See application file for complete search history.

(56) References Cited

U.S. PATENT DOCUMENTS 4,491,697 A * 1/1985 Tanaka ................. H04R 19/016
330/269
8,526,656 B2 * 9/2013 Tanaka ..................... H04R 1/38
381/163

(Continued)

FOREIGN PATENT DOCUMENTS

WO 2012119637 9/2012

OTHER PUBLICATIONS

International Search Report and Written Opinion dated Jul. 21, 2017 for International Application No. PCT/US2017/029980, 17 pages.

*Primary Examiner* — Matthew Eason
(74) *Attorney, Agent, or Firm* — Amin, Turocy & Watson, LLP

(57) ABSTRACT

Microelectromechanical systems (MEMS) sensors and related bias voltage techniques are described. Exemplary MEMS sensors, such as exemplary MEMS acoustic sensors or microphones described herein can employ one or more bias voltage generators and single-ended or differential amplifier arrangements. Various embodiments are described that can effectively increase the bias voltage available to the sensor element without resorting to high breakdown voltage semiconductor processes. In addition, control of the one or more bias voltage generators in various operating modes is described, based on consideration of a number of factors.

19 Claims, 12 Drawing Sheets

(56) References Cited

U.S. PATENT DOCUMENTS

| | | | |
|---|---|---|---|
| 2008/0192962 A1* | 8/2008 | Halteren | H04R 1/222 381/170 |
| 2010/0158274 A1* | 6/2010 | Suvanto | H03G 3/004 381/103 |
| 2012/0025334 A1* | 2/2012 | Chan | H04R 19/005 257/416 |
| 2012/0027235 A1* | 2/2012 | Chan | H04R 19/005 381/174 |
| 2012/0224726 A1* | 9/2012 | Pahl | H04R 1/04 381/174 |
| 2013/0028459 A1* | 1/2013 | Wang | H04R 19/04 381/369 |
| 2013/0136267 A1* | 5/2013 | Hammerschmidt | H04R 3/06 381/58 |
| 2014/0064523 A1* | 3/2014 | Kropfitsch | H03G 1/0094 381/174 |
| 2014/0266260 A1* | 9/2014 | Wurzinger | G01R 27/2605 324/684 |
| 2014/0270250 A1* | 9/2014 | Muza | H04R 1/406 381/94.1 |
| 2015/0125003 A1* | 5/2015 | Wiesbauer | B81B 3/0021 381/111 |
| 2017/0026759 A1* | 1/2017 | Dai | H04R 17/02 |
| 2017/0150262 A1* | 5/2017 | Zeleznik | H04R 3/06 |
| 2017/0223464 A1* | 8/2017 | Voss | H04R 7/04 |
| 2017/0318385 A1* | 11/2017 | Harney | H02M 3/07 |
| 2017/0318395 A1* | 11/2017 | Harney | H04R 19/04 |
| 2017/0347174 A1* | 11/2017 | Chandrasekaran | H04R 1/028 |

\* cited by examiner

MICROELECTROMECHANICAL SYSTEMS (MEMS) MICROPHONE BIAS VOLTAGE

TECHNICAL FIELD

The disclosed subject matter relates to microelectromechanical systems (MEMS) sensors such as MEMS microphones and related voltage biasing techniques.

BACKGROUND

Conventionally, microelectromechanical systems (MEMS) microphones can be fabricated from a substrate, a backplate, and a flexible diaphragm, where the backplate, being in proximity to the flexible diaphragm, can form a variable capacitance device. In an aspect, a backplate can be perforated so that sound pressure entering the MEMS microphone package via a port can pass through the perforated backplate and deflect the diaphragm. In other implementations, sound pressure entering the MEMS microphone package via a port can directly impinge the diaphragm opposite the backplate. In such conventional MEMS microphones a direct current (DC) bias voltage ($V_{bias}$) applied to the backplate (or the diaphragm) facilitates measuring sound pressure induced deflections of the flexible diaphragm as an alternating current AC voltage, thereby providing a useful signal for further processing.

Note that, for a positive $V_{bias}$ applied to the perforated backplate, where sound pressure passes through the perforated backplate to deflect the diaphragm, a positive going pressure wave traveling through the perforated backplate and deflecting the flexible diaphragm away from the perforated backplate will result in a decrease in the variable capacitance, which can result in a negative going output signal. In other words, a generated output signal appears inverted, 180 degrees out of phase, or of opposite polarity with the positive going pressure wave, which is not ideal in some cases.

In addition, some conventional MEMS microphone solutions may not be able to accurately sense very high sound pressure levels. As an example, the ability to accurately sense high sound pressure levels with a MEMS microphone can be limited by the distance between the diaphragm and the backplate, as well as the stiffness of the diaphragm, the designs of which, in turn, can be influenced by available $V_{bias}$ at a microphone front end or operating voltage of an associated application specific integrated circuit (ASIC). However, for conventional bias voltage generator semiconductor circuits typically employed for such MEMS microphone front ends, voltage threshold levels of the semiconductor circuit limits available $V_{bias}$, while high voltage semiconductor circuitry can be expensive in terms of technology cost and die size, which can negatively impact sensor package size and costs.

It is thus desired to provide MEMS device bias voltage techniques that improve upon these and other deficiencies. The above-described deficiencies of MEMS microphones are merely intended to provide an overview of some of the problems of conventional implementations, and are not intended to be exhaustive. Other problems with conventional implementations and techniques and corresponding benefits of the various non-limiting embodiments described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In various non-limiting embodiments of the disclosed subject matter, systems, devices, and methods for providing bias voltage to exemplary MEMS sensors or devices, are described. For instance, exemplary non-limiting implementations provide exemplary MEMS microphones comprising an application specific integrated circuit (ASIC) that can comprise one or more bias voltage generators. For instance, various non-limiting implementations can facilitate providing effectively higher bias voltage to an exemplary MEMS microphone element, for example, by providing a second bias voltage to one portion of an exemplary MEMS microphone element, which is of opposite polarity of that of a first bias voltage provided to another portion of an exemplary MEMS microphone element. In further non-limiting examples, an exemplary ASIC can comprise electronic circuitry coupled to the exemplary MEMS microphone element, for example, that can comprise a single-ended or a differential amplifier, which can facilitate providing a single ended or a differential output. In various non-limiting embodiments as described herein, the disclosed subject matter facilitates operating one or more of the one or more bias voltage generators in a number of modes based consideration of a number of factors including, but not limited to, power consumption, sound pressure level, predetermined noise performance, etc.

Accordingly, various embodiments of the disclosed subject matter facilitate providing output signals having the same polarity as the incident acoustic waves or sound pressure, while providing opportunities for improving one or more of an exemplary MEMS microphone element's robustness and dynamic range or sound pressure level capability associated with the effectively higher bias voltage, as well as opportunities for rejection of common-mode interference, etc., without resorting to high breakdown voltage semiconductor processes.

In further non-limiting implementations, the disclosed subject matter provides exemplary MEMS microphones comprising an ASIC having a positive bias voltage generator or a negative bias voltage generator that facilitates providing output signals having the same polarity as the incident acoustic waves or sound pressure. In further non-limiting implementations, the disclosed subject matter provides exemplary MEMS microphones comprising an ASIC having a single bias voltage generator and a differential amplifier arrangement that facilitates providing output signals having the same polarity as the incident acoustic waves or sound pressure as well as improved opportunities for rejection of common mode interference.

Other non-limiting implementations of the disclosed subject matter provide exemplary systems and methods directed to these and/or other aspects described herein.

BRIEF DESCRIPTION OF THE DRAWINGS

Various non-limiting embodiments are further described with reference to the accompanying drawings in which.

DETAILED DESCRIPTION

Overview

While a brief overview is provided, certain aspects of the disclosed subject matter are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the disclosed subject matter are described in the context of MEMS sensors such as MEMS microphones and related voltage biasing techniques. However, as further detailed below, various exemplary implementations can be applied to other applications of MEMS sensors, without departing from the subject matter described herein.

As described in the background, a positive $V_{bias}$ applied to the perforated backplate, where sound pressure passes through the perforated backplate to deflect the diaphragm, a positive going pressure wave traveling through the perforated backplate and deflecting the flexible diaphragm away from the perforated backplate will result in a decrease in the variable capacitance, which can result in a negative going output signal. This can be understood by reference to FIGS. 1 and 2, for example. In addition, the ability to sense high sound pressure levels (SPL) with a MEMS microphone can be limited by the distance between the diaphragm and the backplate, as well as the stiffness of the diaphragm, the designs of which, in turn, can be influenced by $V_{bias}$ available at a microphone front end or operating voltage of an associated ASIC. Thus, voltage threshold levels of conventional semiconductor circuits typically employed limits available $V_{bias}$, while high voltage semiconductor circuitry can be expensive in terms of technology cost and die size, which can negatively impact sensor package size and costs.

Accordingly, as further described herein, exemplary embodiments of the disclosed subject matter can employ two opposite polarity, lower voltage, bias voltage generators, which, when applied to the flexible diaphragm and the perforated backplate, can provide an effectively higher $V_{bias}$ sufficient for measurement of high sound pressure level events, without the need for employing higher breakdown voltage semiconductor processes. In other non-limiting aspects, various bias voltage techniques are provided that can facilitate providing a generated output signal that is not inverted, is in phase, or is of matching polarity with a positive going pressure wave.

Figure 1:
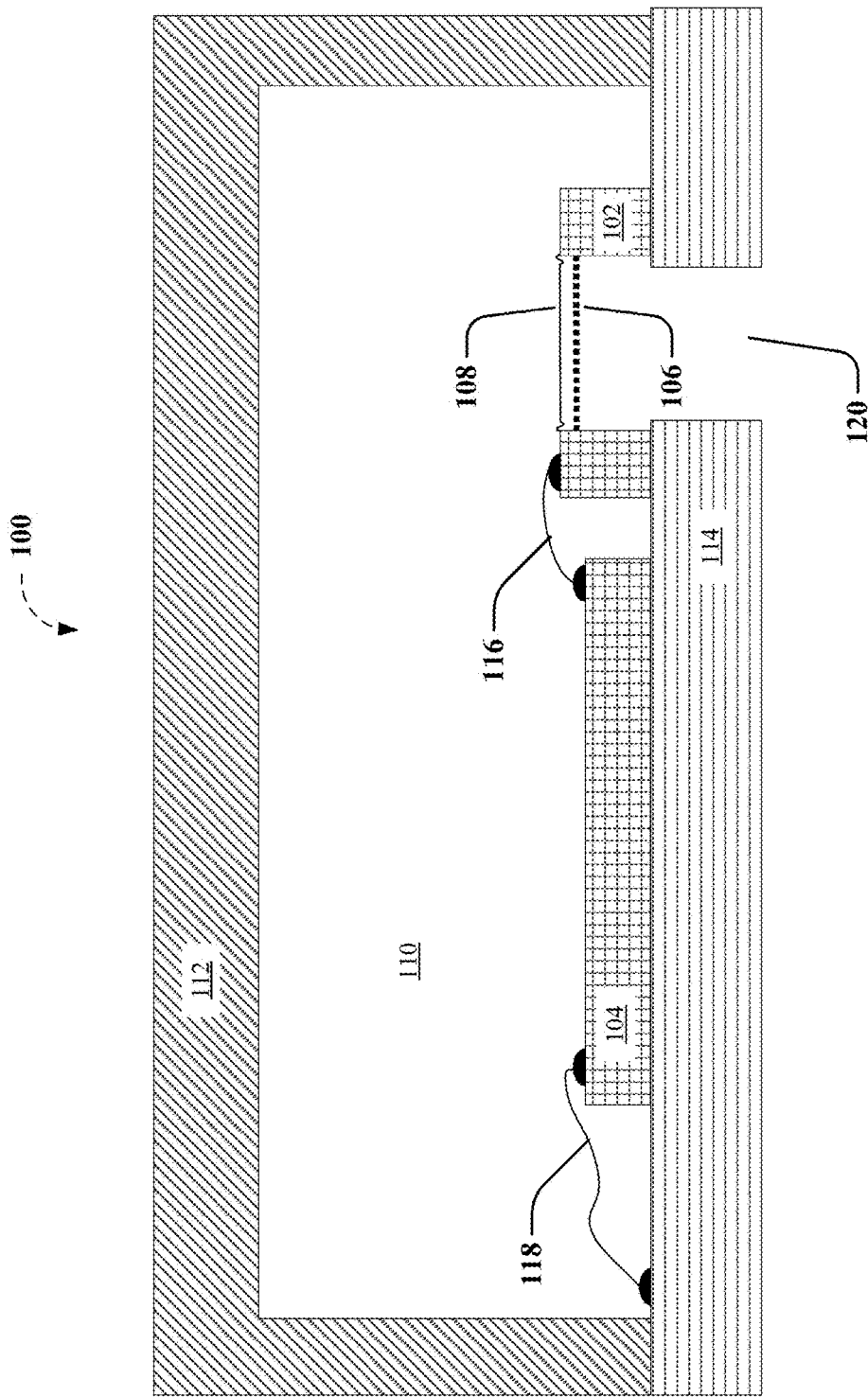
FIG. 1 depicts a non-limiting schematic cross section of an exemplary MEMS sensor device or microphone suitable for incorporating various non-limiting aspects as described herein.

For instance, FIG. 1 depicts a non-limiting schematic cross section of an exemplary MEMS sensor device or microphone 100 suitable for incorporating various non-limiting aspects as described herein. Accordingly, MEMS sensor device or microphone 100 can comprise a MEMS acoustic sensor or microphone element 102. In further exemplary embodiments, MEMS sensor device or microphone 100 can also comprise an ASIC complementary metal oxide semiconductor (CMOS) 104 chip associated with the MEMS acoustic sensor or microphone element 102. In various aspects, MEMS acoustic sensor or microphone element 102 can comprise a perforated backplate 106 that can act as a stationary electrode in concert with a flexible diaphragm 108 to facilitate the transduction of acoustic waves or pressure into an electrical signal that can be operatively coupled to ASIC CMOS 104. Thus, as described above, exemplary MEMS acoustic sensor or microphone element 102 can comprise a perforated backplate 106, and a flexible diaphragm 108, where the perforated backplate 106, being in proximity to the flexible diaphragm 108, can form a variable capacitance device. While the MEMS sensor device or microphone 100 is depicted as an exemplary acoustic sensor or microphone device for the purposes of understanding various non-limiting aspects of the disclosed subject matter, it can be understood that various aspects as described herein are not limited to applications involving acoustic sensors and/or microphone devices, and, as such, may be employed in conjunction with other MEMS sensors or other contexts. For instance, various aspects as described herein can be employed in other applications involving capacitive devices or sensors, and/or devices or sensors including, but not limited to, optical and/or piezoelectric devices or sensors.

As depicted in FIG. 1, the MEMS sensor device or microphone 100 can comprise one of the one or more back cavities 110, which can be defined by a lid or cover 112 attached to package substrate 114, according to a non-limiting aspect, as further described above. In various non-limiting aspects, one or more of MEMS acoustic sensor or microphone element 102, ASIC CMOS 104 chip, and/or lid or cover 112 can be one or more of electrically coupled and/or mechanically affixed to package substrate 114, via methods available to those skilled in the art. As non-limiting examples, MEMS acoustic sensor or microphone element 102 can be bonded to package substrate 114 and electrically coupled to ASIC CMOS 104 (e.g., via wire bond 116), and ASIC CMOS 104 can be bonded and electrically coupled (e.g., via wire bond 118) to package substrate 114. Thus, MEMS acoustic sensor or microphone element 102, in the non-limiting example of MEMS sensor device or microphone 100, is mechanically affixed to package substrate 114, and electrically or operatively coupled to the ASIC CMOS 104 chip.

Furthermore, lid or cover 112 and package substrate 114 together can comprise a package comprising MEMS sensor device or microphone 100, to which a customer printed circuit board (PCB) (not shown) having a port, an orifice, or other means of passing acoustic waves or sound pressure to MEMS acoustic sensor or microphone element 102 can be mechanically, electrically, and/or operatively coupled. For example, acoustic waves or sound pressure can be received at MEMS acoustic sensor or microphone element 102 via package substrate 114 having port 120 adapted to receive acoustic waves or sound pressure. An attached or coupled customer PCB (not shown) providing an orifice or other means of passing the acoustic waves or sound pressure facilitates receiving acoustic waves or sound pressure at MEMS acoustic sensor or microphone element 102.

As described above, in an aspect, backplate 106 can comprise a perforated backplate 106 that facilitates acoustic waves or sound pressure entering the MEMS sensor device or microphone 100 package via a port 120, which can pass through the perforated backplate 106 and deflect the flexible diaphragm 108. In such MEMS microphones, a direct current (DC) bias voltage ($V_{bias}$) applied to the backplate facilitates measuring sound pressure induced deflections of the flexible diaphragm 108 as an alternating current AC voltage, thereby providing a useful signal for further processing (e.g., via ASIC CMOS 104, etc.). While exemplary MEMS sensor device or microphone 100 is described as comprising port 120 that facilitates acoustic waves or sound pressure entering the MEMS sensor device or microphone 100 package via a port 120, pass through the perforated backplate 106, and deflect the flexible diaphragm 108, it can be understood that various aspects as described herein are not limited to implementations involving MEMS sensor device or microphone 100. For instance, as described above, various aspects as described herein, regarding FIGS. 3-7, for example, can be employed in implementations (not shown) where sound pressure entering the MEMS microphone package via a port can directly impinge the diaphragm opposite the backplate.

Figure 2:
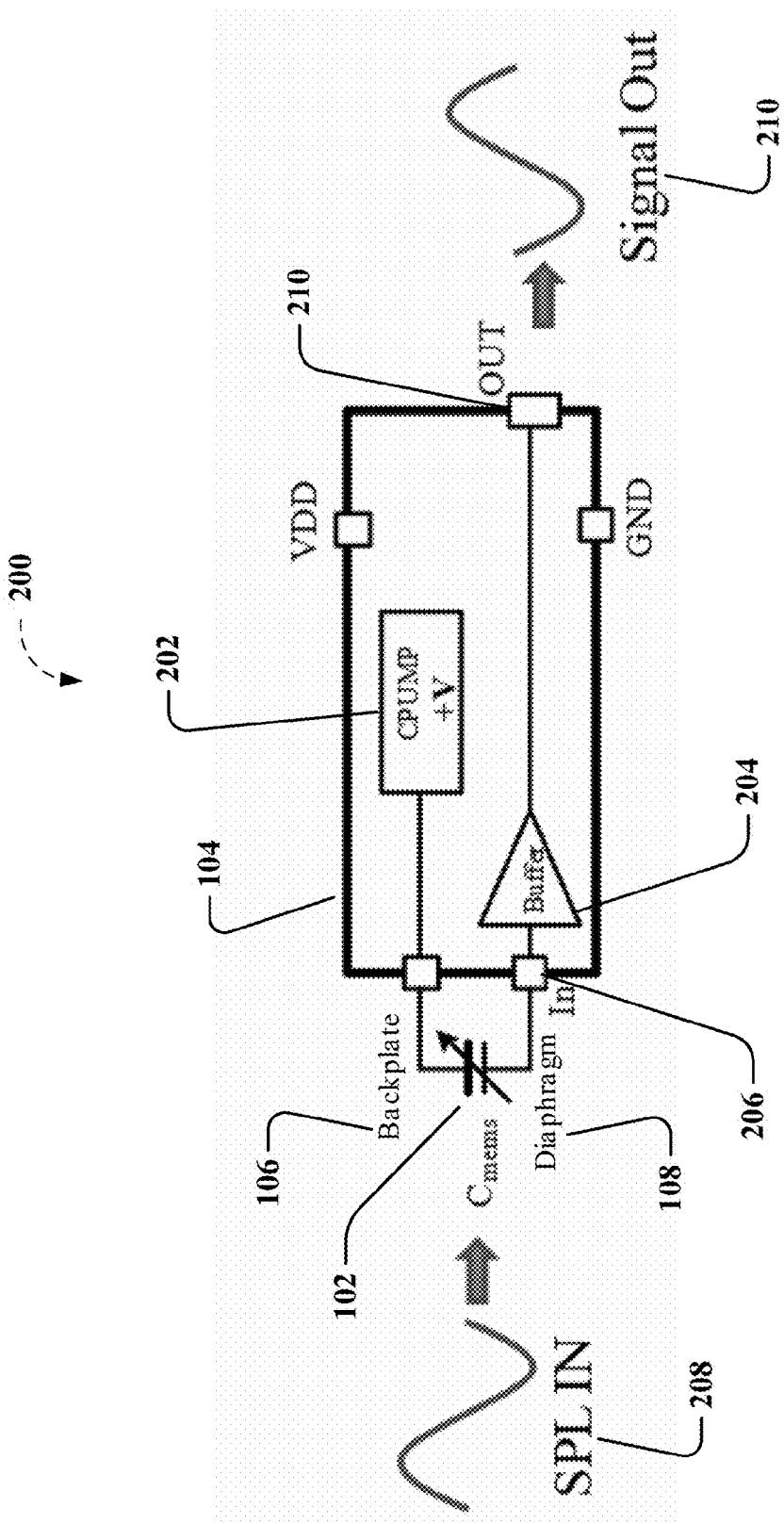
FIG. 2 depicts an exemplary circuit block diagram that illustrates non-limiting aspects of MEMS sensor bias voltage techniques.

Note that, for a positive $V_{bias}$ applied to the perforated backplate 106, where sound acoustic waves or pressure passes through the perforated backplate 106 to deflect the flexible diaphragm 108, a positive going pressure wave traveling through the perforated backplate 106 and deflecting the flexible diaphragm 108 away from the perforated backplate 106 will result in a decrease in the variable capacitance, which can result in a negative going output signal. In other words, as depicted in FIG. 2, for example, a generated output signal would appear inverted, 180 degrees out of phase, or of opposite polarity with the positive going pressure wave, which is not ideal in some cases. As further described above, in non-limiting aspects of the disclosed subject matter, various bias voltage techniques are provided that can facilitate providing a generated output signal that is not inverted, is in phase, or is of matching polarity with a positive going pressure wave.

For example, FIG. 2 depicts an exemplary circuit block diagram 200 that illustrates non-limiting aspects of MEMS sensor bias voltage techniques. For example, FIG. 2 depicts an exemplary circuit block diagram 200 that can comprise an exemplary ASIC CMOS 104 chip. In a non-limiting aspect, ASIC CMOS 104 can be disposed in an exemplary microphone package (e.g., a package comprising lid or cover 112 and package substrate 114 associated with MEMS sensor device or microphone 100, etc.). In a further non-limiting aspect, ASIC CMOS 104 can comprise one or more bias voltage generators. In the exemplary ASIC CMOS 104 depicted in FIG. 2, ASIC CMOS 104 is depicted as comprising bias voltage generator 202. As further depicted in FIG. 2, bias voltage generator 202 can be operatively coupled to a first portion (e.g., perforated backplate 106 or flexible diaphragm 108 or a portion thereof) of MEMS acoustic sensor or microphone element 102 and can be configured to provide a positive bias voltage to the first portion. In a non-limiting aspect, bias voltage generator 202 can be operatively coupled to perforated backplate 106 of MEMS acoustic sensor or microphone element 102 and can be configured to provide a positive bias voltage to the perforated backplate 106. In a further non-limiting aspect, bias voltage generator 202 can comprise a positive charge pump. In yet another non-limiting aspect, bias voltage generator 202 can comprise other bias voltage generation circuitry, such as, some form of switched capacitor circuit, or otherwise, for example, available to one skilled in the art. In a non-limiting aspect, a positive $V_{bias}$ generated by bias voltage generator 202 can comprise voltages many times greater than the applied $V_{dd}$ voltage.

As depicted in FIG. 2, ASIC CMOS 104 can further comprise or be associated with electronic circuitry 204. In a non-limiting aspect, ASIC CMOS 104 can be operatively coupled to MEMS acoustic sensor or microphone element 102. In a further non-limiting aspect, ASIC CMOS 104 can be configured to receive one or more signals 206 that can correspond to acoustic waves or sound pressure 208 applied to flexible diaphragm 108. In exemplary implementations of ASIC CMOS 104, electronic circuitry 204 can comprise a buffer amplifier, wherein an input of the buffer amplifier can be operatively coupled to the flexible diaphragm 108.

As illustrated in FIGS. 1-2, for a positive $V_{bias}$ applied to the perforated backplate 106, where acoustic waves or sound pressure 208 passes through the perforated backplate 106 to deflect the flexible diaphragm 108, a positive going pressure wave traveling through the perforated backplate 106 and deflecting the flexible diaphragm 108 away from the perforated backplate 106 will result in a decrease in the variable capacitance, which can result in a negative going output signal 210. Thus, as depicted in FIG. 2, a generated output signal 210 would appear inverted, 180 degrees out of phase, or of opposite polarity with the positive going pressure wave of acoustic waves or sound pressure 208.

Various aspects or features of the disclosed subject matter are described with reference to the drawings, wherein like reference numerals are used to refer to like elements throughout. In this specification, numerous specific details are set forth in order to provide a thorough understanding of the disclosed subject matter. It should be understood, however, that the certain aspects of disclosure may be practiced without these specific details, or with other methods, components, parameters, chemical compositions, etc. In other instances, well-known structures and devices are shown in block diagram form to facilitate description and illustration of the various embodiments. In accordance with one or more embodiments described in the disclosed subject matter, described herein are MEMS device bias voltage techniques that can employ one or more of the non-limiting aspects as described herein.

Exemplary Embodiments

Figure 3:
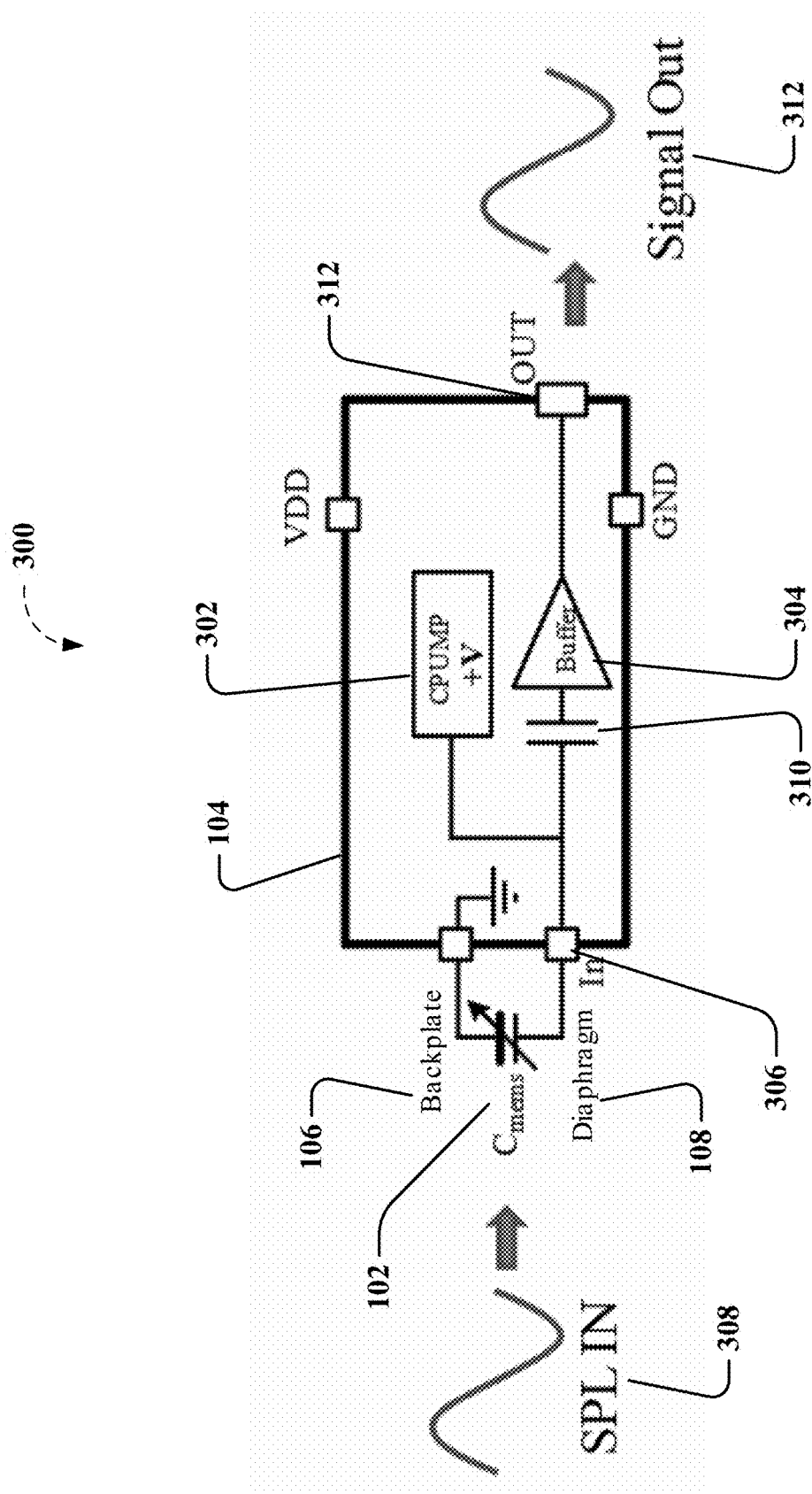
FIG. 3 depicts another exemplary circuit block diagram that illustrates further non-limiting aspects of exemplary MEMS sensor bias voltage techniques, according to various embodiments described herein.

Accordingly, FIG. 3 depicts another exemplary circuit block diagram 300 that illustrates further non-limiting aspects of exemplary MEMS sensor bias voltage techniques, according to various embodiments described herein. For example, FIG. 3 depicts an exemplary circuit block diagram 300 that can comprise an exemplary ASIC CMOS 104. In a non-limiting aspect, ASIC CMOS 104 can be disposed in an exemplary microphone package (e.g., a package comprising lid or cover 112 and package substrate 114 associated with MEMS sensor device or microphone 100, etc.). In a further non-limiting aspect, ASIC CMOS 104 can comprise one or more bias voltage generators. In exemplary ASIC CMOS 104 depicted in FIG. 3, ASIC CMOS 104 is depicted as comprising bias voltage generator 302. As further described above, bias voltage generator 302 can be operatively coupled to a first portion (e.g., perforated backplate 106 or flexible diaphragm 108 or a portion thereof) of MEMS acoustic sensor or microphone element 102 and can be configured to provide a positive bias voltage to the first portion. In a non-limiting aspect, bias voltage generator 302 can be operatively coupled to flexible diaphragm 108 of MEMS acoustic sensor or microphone element 102 and can be configured to provide a positive bias voltage to the flexible diaphragm 108. In a further non-limiting aspect, bias voltage generator 302 can comprise a positive charge pump. As further described above, bias voltage generator 302 can comprise other bias voltage generation circuitry, such as, some form of switched capacitor circuit, or otherwise, for example, available to one skilled in the art. In a non-limiting aspect, a positive $V_{bias}$ generated by bias voltage generator 302 can comprise voltages many times greater than the applied $V_{dd}$ voltage. For example, exemplary bias voltage generator 302 can be configured to provide a positive bias voltage within the range of about 9 to about 19.5 Volts (V).

As depicted in FIG. 3, ASIC CMOS 104 can further comprise or be associated with electronic circuitry 304. In a non-limiting aspect, ASIC CMOS 104 can be operatively coupled to MEMS acoustic sensor or microphone element 102. In a further non-limiting aspect, ASIC CMOS 104 can be configured to receive one or more signals 306 that can correspond to acoustic waves or sound pressure 308 applied to flexible diaphragm 108. According to a further non-limiting aspect, exemplary bias voltage generator 302 and the first portion (e.g., flexible diaphragm 108) can be operatively coupled to the electronic circuitry 304 via a capacitor 310. In exemplary implementations of ASIC CMOS 104, electronic circuitry 304 can comprise a buffer amplifier, wherein an input of the buffer amplifier can be operatively coupled to the first portion (e.g., flexible diaphragm 108 or a portion thereof). Accordingly, in a non-limiting aspect, an exemplary buffer amplifier can be configured to provide a single output signal 312 based on one or more signals 306 that can correspond to acoustic waves or sound pressure 308 applied to flexible diaphragm 108. As further depicted in FIG. 3, a second portion (e.g., the other of the perforated backplate 106 or the flexible diaphragm 108) of MEMS acoustic sensor or microphone element 102 can be operatively coupled to a fixed direct current (DC) potential or a high impedance connection to ground. In another non-limiting aspect, as depicted in FIG. 3, the perforated backplate 106 can be operatively coupled to ground.

Thus, as illustrated in FIG. 3, for a positive $V_{bias}$ applied to the flexible diaphragm 108, where acoustic waves or sound pressure 308 passes through the perforated backplate 106 to deflect the flexible diaphragm 108, a positive going pressure wave traveling through the perforated backplate 106 and deflecting the flexible diaphragm 108 away from the perforated backplate 106 will result in an decrease in the variable capacitance, which can result in a positive going output signal 312. Thus, as depicted in FIG. 3, exemplary embodiments of the disclosed subject matter employing various aspects of circuit block diagram 300 can facilitate providing a generated output signal 312 that is not inverted, is in phase, or is of matching polarity with a positive going pressure wave of acoustic waves or sound pressure 308.

Accordingly, various non-limiting implementations of the disclosed subject matter provide exemplary MEMS microphones (e.g., MEMS sensor device or microphone 100), comprising a MEMS microphone element (e.g., MEMS acoustic sensor or microphone element 102) comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), as described above regarding FIGS. 1 and 3.

In a non-limiting aspect, exemplary MEMS microphones (e.g., MEMS sensor device or microphone 100) can further comprise an ASIC (e.g., ASIC CMOS 104) disposed in the microphone package (e.g., a package comprising lid or cover 112 and package substrate 114 associated with MEMS sensor device or microphone 100, etc.) that can comprise a bias voltage generator (e.g., bias voltage generator 302). In a further non-limiting aspect, exemplary bias voltage generator (e.g., bias voltage generator 302) can be operatively coupled to a first portion (e.g., flexible diaphragm 108) of the MEMS microphone element (e.g., MEMS acoustic sensor or microphone element 102) and can be configured to provide a positive bias voltage to the first portion (e.g., flexible diaphragm 108). In non-limiting embodiments, the first portion (e.g., flexible diaphragm 108) can comprise at least a portion of the diaphragm (e.g., flexible diaphragm 108). In yet another non-limiting aspect, exemplary bias voltage generator (e.g., bias voltage generator 302) can comprise a positive charge pump. In still another non-limiting aspect, exemplary bias voltage generator (e.g., bias voltage generator 302) can be configured to provide the positive bias voltage within the range of about 9 to about 19.5 Volts (V), for example, as further described herein.

In non-limiting embodiments, an exemplary ASIC (e.g., ASIC CMOS 104) can further comprise the electronic circuitry (e.g., electronic circuitry 304 comprising a buffer amplifier), as described above. According to further non-limiting implementations of the disclosed subject matter, exemplary MEMS microphones (e.g., MEMS sensor device or microphone 100) can comprise electronic circuitry (e.g., electronic circuitry 304 comprising a buffer amplifier) associated with the ASIC (e.g., ASIC CMOS 104) operatively coupled to the MEMS microphone element (e.g., MEMS acoustic sensor or microphone element 102 or a portion thereof). In a further non-limiting aspect, exemplary electronic circuitry (e.g., electronic circuitry 304 comprising a buffer amplifier) can comprise a buffer amplifier, and wherein an input of the buffer amplifier can be operatively coupled to the diaphragm (e.g., flexible diaphragm 108 or a portion thereof) and the bias voltage generator (e.g., bias voltage generator 302) via the capacitor (e.g., capacitor 310), as depicted in FIG. 3. According to non-limiting implementations, an exemplary buffer amplifier can be configured to provide a single output signal (e.g., output signal 312) based on the one or more signals (e.g., one or more signals 306) that correspond to the sound pressure (e.g., acoustic waves or sound pressure 308) applied to the diaphragm (e.g., flexible diaphragm 108), wherein polarity of the single output signal (e.g., output signal 312) matches polarity of the sound pressure (e.g., acoustic waves or sound pressure 308) applied to the diaphragm (e.g., flexible diaphragm 108).

In yet another non-limiting aspect, exemplary electronic circuitry (e.g., electronic circuitry 304 comprising a buffer amplifier) can be configured to receive one or more signals (e.g., one or more signals 306) that correspond to sound pressure (e.g., acoustic waves or sound pressure 308) applied to the diaphragm (e.g., flexible diaphragm 108), wherein the bias voltage generator (e.g., bias voltage generator 302) and the first portion (e.g., flexible diaphragm 108) are operatively coupled to the electronic circuitry (e.g., electronic circuitry 304 comprising a buffer amplifier) via a capacitor (e.g., capacitor 310).

In further non-limiting implementations of exemplary MEMS microphones (e.g., MEMS sensor device or microphone 100), a second portion (e.g., perforated backplate 106 or a portion thereof) of the MEMS microphone element (e.g., MEMS acoustic sensor or microphone element 102) can be operatively coupled to a fixed DC potential or a high impedance connection to ground, for example, as further described herein. In another non-limiting aspect, the second portion (e.g., perforated backplate 106) can comprise at least a portion of the backplate (e.g., perforated backplate 106).

Further non-limiting implementations of the disclosed subject matter provide exemplary systems comprising a MEMS microphone (e.g., MEMS sensor device or microphone 100) element comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), for example, as described above regarding FIGS. 1 and 3.

For instance, exemplary systems comprising a MEMS microphone (e.g., MEMS sensor device or microphone 100) can comprise a means for applying a bias voltage (e.g., bias voltage generator 302) to a first portion (e.g., flexible diaphragm 108) of the MEMS microphone element (e.g., MEMS acoustic sensor or microphone element 102). As non-limiting examples, exemplary means for applying the bias voltage (e.g., bias voltage generator 302) can comprise a charge pump and/or can comprise means for applying the bias voltage (e.g., via bias voltage generator 302) within the range of about 9 to about 19.5 Volts (V), for example, as further described herein.

Exemplary systems comprising a MEMS microphone (e.g., MEMS sensor device or microphone 100) can further comprise means for receiving (e.g., electronic circuitry 304 comprising a buffer amplifier) one or more signals (e.g., one or more signals 306) from the first portion (e.g., flexible diaphragm 108) of the MEMS microphone element (e.g., MEMS acoustic sensor or microphone element 102) in response to a sensor signal change (e.g., a capacitance change) between the diaphragm (e.g., flexible diaphragm 108) and the backplate (e.g., perforated backplate 106). In a non-limiting aspect, exemplary means for applying the bias voltage (e.g., bias voltage generator 302) and the first portion (e.g., flexible diaphragm 108) can be operatively coupled to the means for receiving (e.g., electronic circuitry 304 comprising a buffer amplifier) the one or more signals (e.g., one or more signals 306) via a capacitor (e.g., capacitor 310).

Furthermore, in various non-limiting embodiments, exemplary means for applying the bias voltage (e.g., bias voltage generator 302) to the first portion (e.g., flexible diaphragm 108) and exemplary means for receiving (e.g., electronic circuitry 304 comprising a buffer amplifier) the one or more signals (e.g., one or more signals 306) from the first portion (e.g., flexible diaphragm 108) can comprise means for applying the bias voltage (e.g., bias voltage generator 302) to at least a portion of the diaphragm (e.g., flexible diaphragm 108) and/or means for receiving (e.g., electronic circuitry 304 comprising a buffer amplifier) the one or more signals (e.g., one or more signals 406) from the at least the portion of the diaphragm (e.g., flexible diaphragm 108), respectively.

In addition, exemplary systems comprising a MEMS microphone (e.g., MEMS sensor device or microphone 100) can also comprise means for creating (e.g., electronic circuitry 304 comprising a buffer amplifier) an output signal (e.g., output signal 312) associated with the sensor signal change (e.g., a capacitance change), wherein the output signal (e.g., output signal 312) matches polarity with sound pressure (e.g., acoustic waves or sound pressure 308) applied to the diaphragm (e.g., flexible diaphragm 108).

Figure 4:
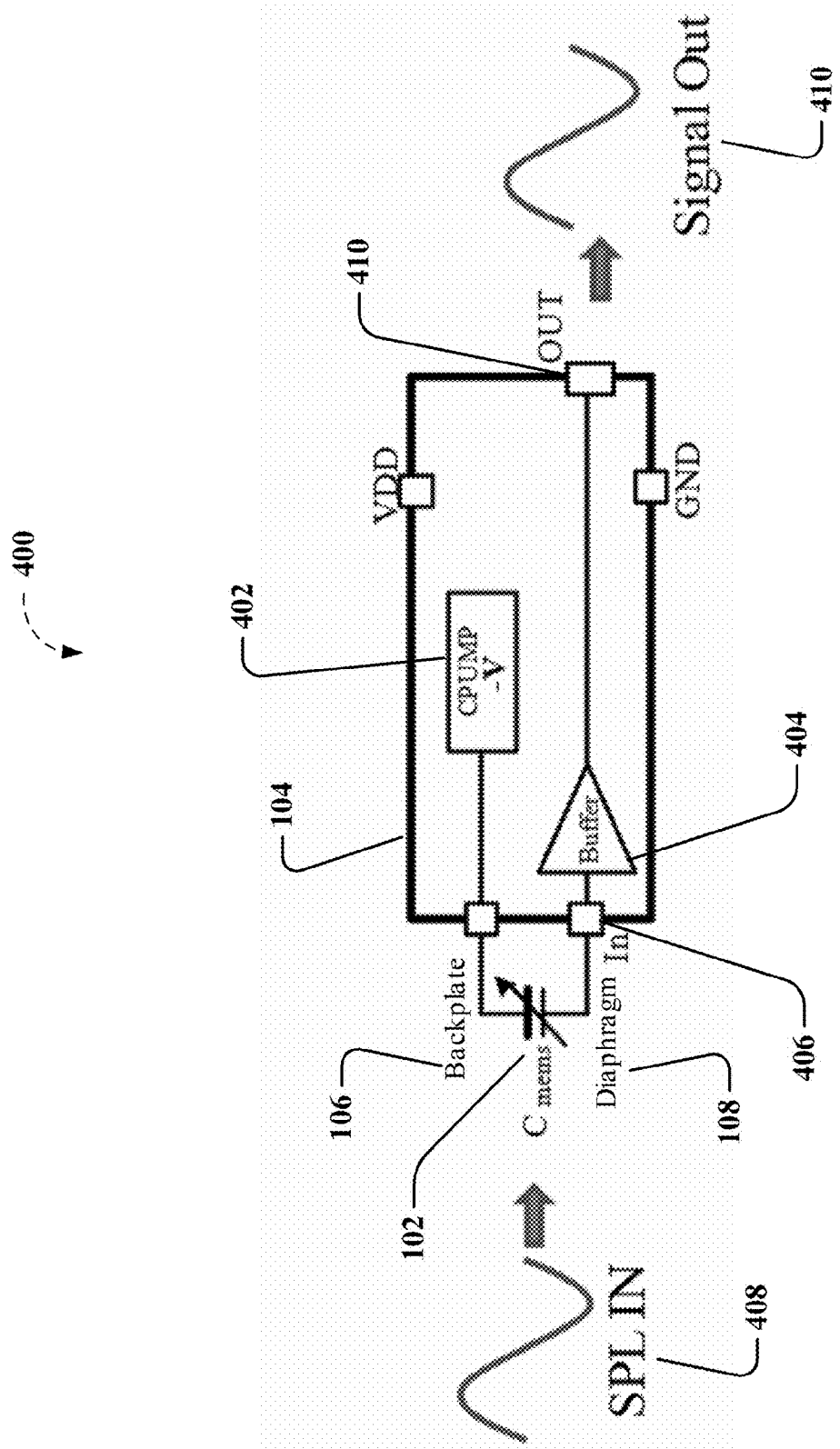
FIG. 4 depicts an exemplary circuit block diagram that illustrates further exemplary MEMS sensor bias voltage techniques, according to further embodiments described herein.

FIG. 4 depicts an exemplary circuit block diagram 400 that illustrates further exemplary MEMS sensor bias voltage techniques, according to further embodiments described herein. For example, FIG. 4 depicts an exemplary circuit block diagram 400 that can comprise an exemplary ASIC CMOS 104. In a non-limiting aspect, ASIC CMOS 104 can be disposed in an exemplary microphone package (e.g., a package comprising lid or cover 112 and package substrate 114 associated with MEMS sensor device or microphone 100, etc.). In a further non-limiting aspect, ASIC CMOS 104 can comprise one or more bias voltage generators. In exemplary ASIC CMOS 104 depicted in FIG. 4, ASIC CMOS 104 is depicted as comprising bias voltage generator 402. As further described above, bias voltage generator 402 can be operatively coupled to a first portion (e.g., perforated backplate 106 or flexible diaphragm 108 or a portion thereof) of MEMS acoustic sensor or microphone element 102 and can be configured to provide a negative bias voltage to the first portion. In a non-limiting aspect, bias voltage generator 402 can be operatively coupled to perforated backplate 106 of MEMS acoustic sensor or microphone element 102 and can be configured to provide a negative bias voltage to the perforated backplate 106. In a further non-limiting aspect, bias voltage generator 402 can comprise a negative charge pump. As further described above, bias voltage generator 402 can comprise other bias voltage generation circuitry, such as, some form of switched capacitor circuit, or otherwise, for example, available to one skilled in the art. For example, exemplary bias voltage generator 402 can be configured to provide a negative bias voltage within the range of about −15 to about −7.5 V.

As depicted in FIG. 4, ASIC CMOS 104 can further comprise or be associated with electronic circuitry 404. In a non-limiting aspect, ASIC CMOS 104 can be operatively coupled to MEMS acoustic sensor or microphone element 102. In a further non-limiting aspect, ASIC CMOS 104 can be configured to receive one or more signals 406 that can correspond to acoustic waves or sound pressure 408 applied to flexible diaphragm 108. In exemplary implementations of ASIC CMOS 104, electronic circuitry 404 can comprise a buffer amplifier, wherein an input of the buffer amplifier can be operatively coupled to a second portion (e.g., flexible diaphragm 108) of MEMS acoustic sensor or microphone element 102. Accordingly, in a non-limiting aspect, an exemplary buffer amplifier can be configured to provide a single output signal 410 based on one or more signals 406 that can correspond to acoustic waves or sound pressure 408 applied to flexible diaphragm 108.

Thus, as illustrated in FIG. 4, for a negative $V_{bias}$ applied to the perforated backplate 106, where acoustic waves or sound pressure 408 passes through the perforated backplate 106 to deflect the flexible diaphragm 108, a positive going pressure wave traveling through the perforated backplate 106 and deflecting the flexible diaphragm 108 away from the perforated backplate 106 will result in an decrease in the variable capacitance, which can result in a positive going output signal 410. Thus, as depicted in FIG. 4, exemplary embodiments of the disclosed subject matter employing various aspects of circuit block diagram 400 can facilitate providing a generated output signal 410 that is not inverted, is in phase, or is of matching polarity with a positive going pressure wave of acoustic waves or sound pressure 408.

Accordingly, various non-limiting implementations of the disclosed subject matter provide exemplary MEMS microphones (e.g., MEMS sensor device or microphone 100) comprising a MEMS microphone element (e.g., MEMS acoustic sensor or microphone element 102) comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), as described above regarding FIGS. 1 and 4.

In a non-limiting aspect, exemplary MEMS microphones (e.g., MEMS sensor device or microphone 100) can further comprise an ASIC (e.g., ASIC CMOS 104) disposed in the microphone package (e.g., a package comprising lid or cover 112 and package substrate 114 associated with MEMS sensor device or microphone 100, etc.) comprising a bias voltage generator (e.g., bias voltage generator 402). In a further non-limiting aspect, exemplary bias voltage generator (e.g., bias voltage generator 402) can be operatively coupled to a first portion (e.g., perforated backplate 106 or a portion thereof) of the MEMS microphone element (e.g., MEMS acoustic sensor or microphone element 102) and configured to provide a negative bias voltage to the first portion (e.g., perforated backplate 106). In non-limiting embodiments, the first portion (e.g., perforated backplate 106 or a portion thereof) can comprise at least a portion of the backplate (e.g., perforated backplate 106). In yet another non-limiting aspect, exemplary bias voltage generator (e.g., bias voltage generator 402) can comprise a negative charge pump. In still another non-limiting aspect, exemplary bias voltage generator (e.g., bias voltage generator 402) can be configured to provide the negative bias voltage within the range of about −15 to about −7.5 Volts (V), for example, as further described herein.

In non-limiting embodiments, an exemplary ASIC (e.g., ASIC CMOS 104) can further comprise electronic circuitry (e.g., electronic circuitry 404 comprising a buffer amplifier), as described above. In a further non-limiting aspect, exemplary electronic circuitry (e.g., electronic circuitry 404 comprising a buffer amplifier) can comprise a buffer amplifier, and wherein an input of the buffer amplifier can be operatively coupled to a second portion (e.g., flexible diaphragm 108 or a portion thereof) of the MEMS microphone element (e.g., MEMS acoustic sensor or microphone element 102). According to further non-limiting implementations of the disclosed subject matter, exemplary MEMS microphones (e.g., MEMS sensor device or microphone 100) can comprise electronic circuitry (e.g., electronic circuitry 404 comprising a buffer amplifier) associated with the ASIC (e.g., ASIC CMOS 104) operatively coupled to a second portion (e.g., flexible diaphragm 108 or a portion thereof) of the MEMS microphone element (e.g., MEMS acoustic sensor or microphone element 102 or a portion thereof). In still another non-limiting aspect, the second portion (e.g., flexible diaphragm 108 or a portion thereof) can comprise at least a portion of the diaphragm (e.g., flexible diaphragm 108), for example, as described above regarding FIG. 3. In non-limiting embodiments, exemplary electronic circuitry (e.g., electronic circuitry 404 comprising a buffer amplifier) associated with the ASIC (e.g., ASIC CMOS 104) operatively coupled to a second portion (e.g., flexible diaphragm 108 or a portion thereof) can be configured to receive one or more signals (e.g., one or more signals 406) that correspond to sound pressure (e.g., acoustic waves or sound pressure 408) applied to the diaphragm (e.g., flexible diaphragm 108).

Accordingly, exemplary buffer amplifier (e.g., buffer amplifier associated with electronic circuitry 404) can be configured to provide a single output signal (e.g., output signal 410) based on the one or more signals (e.g., one or more signals 406) that correspond to the sound pressure (e.g., acoustic waves or sound pressure 408) applied to the diaphragm (e.g., flexible diaphragm 108), wherein polarity of the single output signal (e.g., output signal 410) matches polarity of the sound pressure (e.g., acoustic waves or sound pressure 408) applied to the diaphragm (e.g., flexible diaphragm 108).

Further non-limiting implementations of the disclosed subject matter provide exemplary systems comprising a MEMS microphone (e.g., MEMS sensor device or microphone 100) element comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), for example, as described above regarding FIGS. 1 and 4.

For instance, exemplary systems comprising a MEMS microphone (e.g., MEMS sensor device or microphone 100) can comprise a means for applying a bias voltage (e.g., bias voltage generator 402) to a first portion (e.g., perforated backplate 106) of the MEMS microphone element (e.g., MEMS acoustic sensor or microphone element 102). As non-limiting examples, exemplary means for applying the bias voltage can comprise a charge pump and/or can comprise means for applying the bias voltage (e.g., bias voltage generator 402) to the first portion (e.g., perforated backplate 106) can comprise means for applying the bias voltage (e.g., bias voltage generator 402) to at least a portion of the backplate (e.g., perforated backplate 106), can comprise means for applying the bias voltage (e.g., bias voltage generator 402), and/or can comprise means for applying the bias voltage (e.g., via bias voltage generator 402) within the range of about −15 to about −7.5 Volts (V), for example, as further described herein.

Exemplary systems comprising a MEMS microphone (e.g., MEMS sensor device or microphone 100) can further comprise means for receiving (e.g., electronic circuitry 404 comprising a buffer amplifier) one or more signals (e.g., one or more signals 406) from a second portion (e.g., flexible diaphragm 108 or a portion thereof) of the MEMS microphone element (e.g., MEMS acoustic sensor or microphone element 102) in response to a sensor signal change (e.g., a capacitance change) between the diaphragm (e.g., flexible diaphragm 108) and the backplate (e.g., perforated backplate 106). In a non-limiting aspect, exemplary means for receiving (e.g., electronic circuitry 404 comprising a buffer amplifier) the one or more signals (e.g., one or more signals 406) from the second portion (e.g., flexible diaphragm 108 or a portion thereof) can comprise means for receiving (e.g., electronic circuitry 404 comprising a buffer amplifier) the one or more signals (e.g., one or more signals 406) from at least a portion of the diaphragm (e.g., flexible diaphragm 108).

In addition, exemplary systems comprising a MEMS microphone (e.g., MEMS sensor device or microphone 100) can also comprise means for creating (e.g., electronic circuitry 404 comprising a buffer amplifier) an output signal (e.g., output signal 410) associated with sensor signal change (e.g., a capacitance change), wherein the output signal (e.g., output signal 410) matches polarity with sound pressure (e.g., acoustic waves or sound pressure 408) applied to the diaphragm (e.g., flexible diaphragm 108). In a further non-limiting aspect, exemplary means for creating (e.g., electronic circuitry 404 comprising a buffer amplifier) the output signal (e.g., output signal 410) can comprise a buffer amplifier.

Note that, as with exemplary circuit block diagrams 300 and 400, the $V_{bias}$ voltages can be generated by some form of switched capacitor circuit with the possible voltages generated being many times greater than the applied $V_{dd}$ voltage. Nevertheless, conventional bias voltage generator semiconductor processes typically employed for such MEMS microphone front ends can have a breakdown voltage limit that prevents achieving sufficiently high $V_{bias}$. It can be understood that, for a microphone front end (e.g., exemplary circuit block diagrams 300 and 400, etc.), the higher the $V_{bias}$ voltage applied to the MEMS acoustic sensor or microphone element 102, the higher the overall sensitivity that can be provided by MEMS acoustic sensor or microphone element 102 designs. In addition, for MEMS acoustic sensor or microphone element 102 designs targeted to MEMS sensor device or microphone 100 applications requiring the same sensitivity, a higher $V_{bias}$ or an effectively higher $V_{bias}$ allows for MEMS acoustic sensor or microphone element 102 employing stiffer structures (e.g., one or more of perforated backplate 106 or flexible diaphragm 108) that provide enhanced robustness to stiction (e.g., greater restoring force).

However, as described above, higher voltages are limited by the breakdown voltage of the semiconductor process used to manufacture the electronics. Unless special high voltage semiconductor fabrication processes are employed, conventional ASIC CMOS 104 $V_{bias}$ voltages are desired to be kept below about 25 V. Accordingly, as further described herein, exemplary embodiments of the disclosed subject matter can employ two opposite polarity, lower voltage, bias voltage generators, which, when applied to the flexible diaphragm 108 and the perforated backplate 106, can provide an effectively higher $V_{bias}$ sufficient for measurement of high sound pressure level (SPL) events without the need for employing higher breakdown voltage semiconductor processes.

Figure 5:
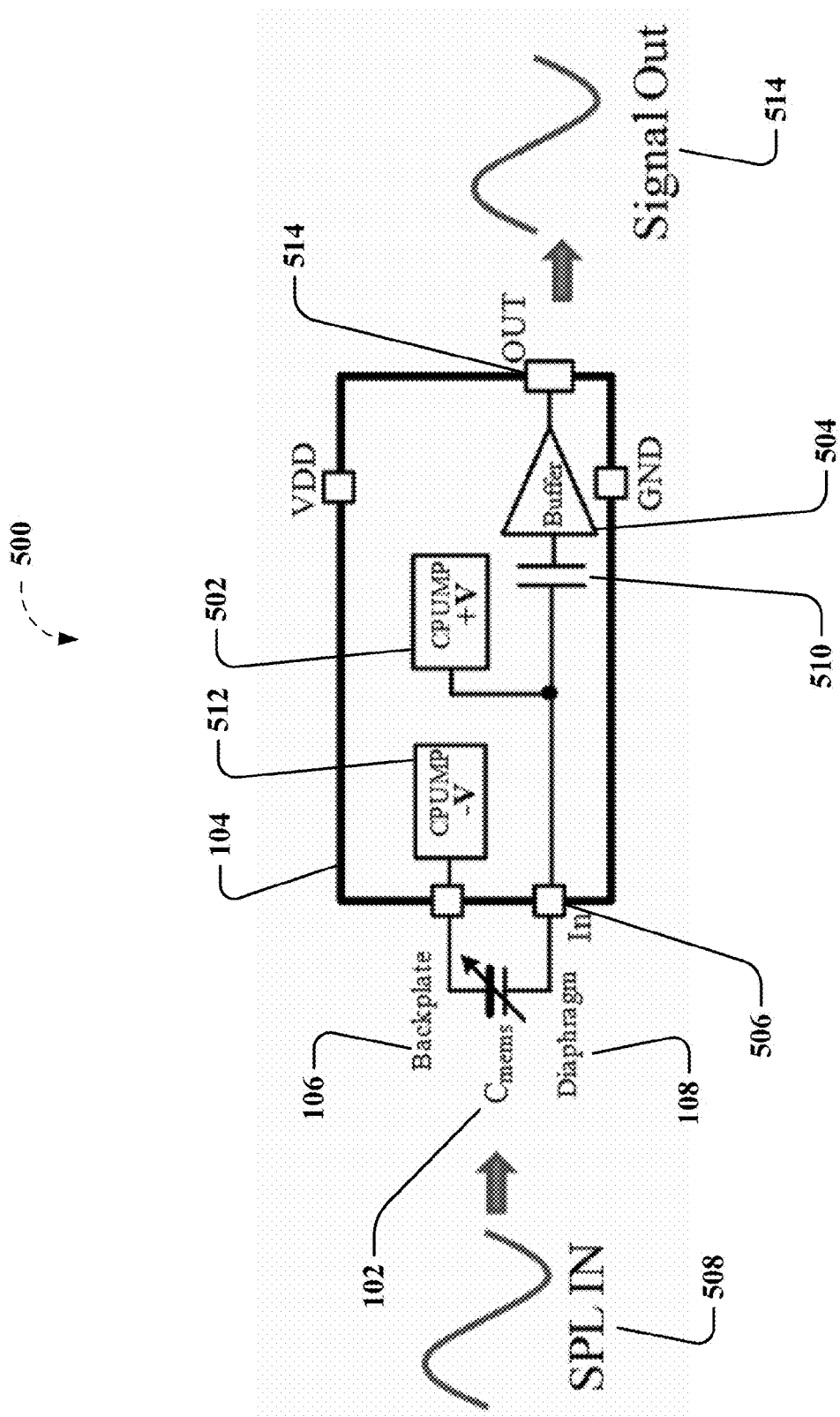
FIG. 5 depicts another exemplary circuit block diagram that illustrates still further non-limiting MEMS sensor bias voltage techniques, according to further embodiments described herein.

Thus, FIG. 5 depicts another exemplary circuit block diagram 500 that illustrates still further exemplary MEMS sensor bias voltage techniques, according to further embodiments described herein. For example, FIG. 5 depicts an exemplary circuit block diagram 500 that can comprise an exemplary ASIC CMOS 104. In a non-limiting aspect, ASIC CMOS 104 can be disposed in an exemplary microphone package (e.g., a package comprising lid or cover 112 and package substrate 114 associated with MEMS sensor device or microphone 100, etc.). In a further non-limiting aspect, ASIC CMOS 104 can comprise one or more bias voltage generators. In exemplary ASIC CMOS 104 depicted in FIG. 5, ASIC CMOS 104 is depicted as comprising first bias voltage generator 502. As further described above, first bias voltage generator 502 can be operatively coupled to a first portion (e.g., perforated backplate 106 or flexible diaphragm 108 or a portion thereof) of MEMS acoustic sensor or microphone element 102 and can be configured to provide a positive bias voltage to the first portion. In a non-limiting aspect, first bias voltage generator 502 can be operatively coupled to flexible diaphragm 108 of MEMS acoustic sensor or microphone element 102 and can be configured to provide a positive bias voltage to the flexible diaphragm 108. In a further non-limiting aspect, first bias voltage generator 502 can comprise a positive charge pump. As further described above, first bias voltage generator 502 can comprise other bias voltage generation circuitry, such as, some form of switched capacitor circuit, or otherwise, for example, available to one skilled in the art. In a non-limiting aspect, a positive $V_{bias}$ generated by first bias voltage generator 502 can comprise voltages many times greater than the applied $V_{dd}$ voltage. For example, exemplary first bias voltage generator 502 can be configured to provide a positive bias voltage within the range of about 9 to about 19.5 Volts (V).

As depicted in FIG. 5, ASIC CMOS 104 can further comprise or be associated with electronic circuitry 504. In a non-limiting aspect, ASIC CMOS 104 can be operatively coupled to MEMS acoustic sensor or microphone element 102. In a further non-limiting aspect, ASIC CMOS 104 can be configured to receive one or more signals 506 that can correspond to acoustic waves or sound pressure 508 applied to flexible diaphragm 108. According to a further non-limiting aspect, exemplary first bias voltage generator 502 and the first portion (e.g., flexible diaphragm 108) can be operatively coupled to the electronic circuitry 504 via a capacitor 510. In exemplary implementations of ASIC CMOS 104, electronic circuitry 504 can comprise a buffer amplifier, wherein an input of the buffer amplifier can be operatively coupled to the first portion (e.g., flexible diaphragm 108 or a portion thereof).

As further depicted in FIG. 5, exemplary ASIC CMOS 104 can further comprise second bias voltage generator 512. As further described above, second bias voltage generator 512 can be operatively coupled to a second portion (e.g., the other of the perforated backplate 106 or flexible diaphragm 108 or a portion thereof) of MEMS acoustic sensor or microphone element 102 and can be configured to provide a negative bias voltage to the second portion. In a non-limiting aspect, second bias voltage generator 512 can be operatively coupled to perforated backplate 106 of MEMS acoustic sensor or microphone element 102 and can be configured to provide a negative bias voltage to the perforated backplate 106. In a further non-limiting aspect, second bias voltage generator 512 can comprise a negative charge pump. As further described above, second bias voltage generator 512 can comprise other bias voltage generation circuitry, such as, some form of switched capacitor circuit, or otherwise, for example, available to one skilled in the art. For example, exemplary second bias voltage generator 512 can be configured to provide a negative bias voltage within the range of about −15 to about −7.5 V.

As a result of employing exemplary bias voltage generators 502 and 512, wherein the second bias voltage of second bias voltage generator 512 is of opposite polarity of the first bias voltage of first bias voltage generator 502, an effectively higher $V_{bias}$ can be applied to MEMS acoustic sensor or microphone element 102 due to the effective bias voltage between perforated backplate 106 and flexible diaphragm 108, being the sum of the magnitude of the two bias voltages. Note that exemplary bias voltage generators 502 and 512 can be maximized without resorting to higher breakdown voltage semiconductor processes. Accordingly, as described above, MEMS acoustic sensor or microphone element 102 designs can provide enhanced robustness to stiction by allowing for wider sense gap between the perforated backplate 106 and flexible diaphragm 108 and/or can provide MEMS acoustic sensor or microphone element 102 designs that can tolerate greater sound pressure levels, resulting in MEMS sensor devices or microphones 100 having higher dynamic range).

Accordingly, in a non-limiting aspect, an exemplary buffer amplifier of electronic circuitry 504 can be configured to provide a single output signal 514 based on one or more signals 506 that can correspond to acoustic waves or sound pre 508 applied to flexible diaphragm 108. Thus, as illustrated in FIG. 5, for a positive $V_{bias}$ applied to the flexible diaphragm 108, where acoustic waves or sound pressure 508 passes through the perforated backplate 106 to deflect the flexible diaphragm 108, a positive going pressure wave traveling through the perforated backplate 106 and deflecting the flexible diaphragm 108 away from the perforated backplate 106 will result in an decrease in the variable capacitance, which can result in a positive going output signal 514. Thus, as depicted in FIG. 5, exemplary embodiments of the disclosed subject matter employing various aspects of circuit block diagram 500 can facilitate providing a generated output signal 514 that is not inverted, is in phase, or is of matching polarity with a positive going pressure wave of acoustic waves or sound pressure 508, while facilitating increased sensitivity and/or robustness of MEMS acoustic sensor or microphone element 102 without resorting to higher breakdown voltage semiconductor processes.

Accordingly, various non-limiting implementations of the disclosed subject matter provide exemplary MEMS microphones (e.g., MEMS sensor device or microphone 100), comprising a MEMS microphone element (e.g., MEMS acoustic sensor or microphone element 102) comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), as described above regarding FIGS. 1 and 5.

In a non-limiting aspect, exemplary MEMS microphones (e.g., MEMS sensor device or microphone 100) can further comprise an ASIC (e.g., ASIC CMOS 104) disposed in the microphone package (e.g., a package comprising lid or cover 112 and package substrate 114 associated with MEMS sensor device or microphone 100, etc.) comprising a first bias voltage generator (e.g., bias voltage generator 502) and a second bias voltage generator (e.g., bias voltage generator 512). In a further non-limiting aspect, exemplary first bias voltage generator (e.g., bias voltage generator 502) can be operatively coupled to the diaphragm (e.g., flexible diaphragm 108 or a portion thereof) and can be configured to provide a first bias voltage to the diaphragm (e.g., flexible diaphragm 108). In another non-limiting aspect, and exemplary second bias voltage generator (e.g., bias voltage generator 512) can be operatively coupled to the backplate (e.g., perforated backplate 106 or a portion thereof) and can be configured to provide a second bias voltage to the backplate (e.g., perforated backplate 106), wherein the second bias voltage can be of opposite polarity of the first bias voltage, according non-limiting aspects.

In non-limiting embodiments, an exemplary first bias voltage can be of positive polarity and exemplary second bias voltage can be of negative polarity, as further described herein. In other non-limiting embodiments, exemplary first bias voltage generator (e.g., bias voltage generator 502) can comprise a positive charge pump and/or exemplary second bias voltage generator (e.g., bias voltage generator 512) can comprise a negative charge pump. In still other non-limiting examples, exemplary first bias voltage generator (e.g., bias voltage generator 502) can be configured to provide the positive bias voltage within the range of about 9 to about 19.5 Volts (V), and exemplary second bias voltage generator (e.g., bias voltage generator 512) can be configured to provide the negative bias voltage within the range of about −15 to about −7.5 Volts (V), for example, as further described herein. In another non-limiting aspect, exemplary first bias voltage (e.g., via bias voltage generator 502) and exemplary second bias voltage (e.g. via bias voltage generator 512) can be maintained substantially equal in magnitude.

In non-limiting embodiments, an exemplary ASIC (e.g., ASIC CMOS 104) can further comprise electronic circuitry (e.g., electronic circuitry 504 comprising a buffer amplifier), as described above. According to further non-limiting implementations of the disclosed subject matter, exemplary MEMS microphones (e.g., MEMS sensor device or microphone 100) comprising exemplary electronic circuitry (e.g., electronic circuitry 504 comprising a buffer amplifier) can be operatively coupled to the MEMS microphone element (e.g., MEMS acoustic sensor or microphone element 102 or a portion thereof). In a further non-limiting aspect, exemplary electronic circuitry (e.g., electronic circuitry 504 comprising a buffer amplifier) can comprise a buffer amplifier, wherein an input of the buffer amplifier can be operatively coupled to the diaphragm (e.g., flexible diaphragm 108 or a portion thereof) via a capacitor (e.g., capacitor 510), as depicted in FIG. 5. In yet another non-limiting aspect, exemplary electronic circuitry (e.g., electronic circuitry 504 comprising a buffer amplifier) can be configured to receive one or more signals (e.g., one or more signals 506) that correspond to a sound pressure (e.g., acoustic waves or sound pressure 508) applied to the diaphragm (e.g., flexible diaphragm 108). According to non-limiting implementations, an exemplary buffer amplifier can be configured to provide a single output signal (e.g., output signal 512) based on the one or more signals (e.g., one or more signals 506) that correspond to the sound pressure (e.g., acoustic waves or sound pressure 508) applied to the diaphragm (e.g., flexible diaphragm 108), wherein polarity of the single output signal (e.g., output signal 514) matches polarity of the sound pressure (e.g., acoustic waves or sound pressure 508) applied to the diaphragm (e.g., flexible diaphragm 108).

In still other non-limiting aspects, exemplary ASIC (e.g., ASIC CMOS 104) can be further configured to operate one or more of the first bias voltage generator (e.g., bias voltage generator 502) or the second bias voltage generator (e.g., bias voltage generator 512) in one or more of a set of modes based on power consumption, sound pressure level, predetermined noise performance the MEMS microphone (e.g., MEMS sensor device or microphone 100), and/or other considerations, for example, as further described herein. In still another non-limiting aspect, one or more of the exemplary set of modes can comprise variation of one or more voltage associated with the one or more of the first bias voltage generator (e.g., bias voltage generator 502) or the second bias voltage generator (e.g., bias voltage generator 512) between zero and a maximum voltage level associated with the one or more of the first bias voltage generator (e.g., bias voltage generator 502) or the second bias voltage generator (e.g., bias voltage generator 512).

Further non-limiting implementations of the disclosed subject matter provide exemplary systems, directed to exemplary capacitive MEMS sensors (e.g., MEMS sensor device or microphone 100. In a non-limiting aspect, exemplary capacitive MEMS sensors can comprise a diaphragm (e.g., flexible diaphragm 108) and a backplate (e.g., perforated backplate 106) of an exemplary MEMS acoustic sensor or microphone element 102 disposed in a microphone package (e.g., a package comprising lid or cover 112 and package substrate 114 associated with MEMS sensor device or microphone 100, etc.), for example, as described above regarding FIGS. 1 and 5. As further described above regarding FIGS. 1 and 5, exemplary systems can comprise a first portion (e.g., flexible diaphragm 108 or a portion thereof) of a capacitive MEMS sensor (e.g., MEMS sensor device or microphone 100) and a second portion (e.g., perforated backplate 106 or a portion thereof) of the capacitive MEMS sensor (e.g., MEMS sensor device or microphone 100). In non-limiting aspects, the first portion (e.g., flexible diaphragm 108 or a portion thereof) can comprise a diaphragm (e.g., flexible diaphragm 108) of a MEMS microphone and/or the second portion (e.g., perforated backplate 106 or a portion thereof) can comprise a backplate (e.g., perforated backplate 106) of the MEMS microphone.

Exemplary systems can further comprise an ASIC (e.g., ASIC CMOS 104) associated with the capacitive MEMS sensor (e.g., MEMS sensor device or microphone 100) comprising a buffer amplifier (e.g., buffer amplifier associated with electronic circuitry 504) and one or more bias voltage generators (e.g., one or more of bias voltage generator 502 or bias voltage generator 512). As a non-limiting example, an input of an exemplary buffer amplifier can be operatively coupled to the first portion (e.g., flexible diaphragm 108 or a portion thereof) of the capacitive MEMS sensor (e.g., MEMS sensor device or microphone 100). Accordingly, in yet other non-limiting implementations, exemplary electronic circuitry (e.g., electronic circuitry 504 comprising a buffer amplifier) can be configured to receive one or more signals (e.g., 506) that correspond to a sound pressure (e.g., acoustic waves or sound pressure 508) applied to the diaphragm (e.g., flexible diaphragm 108). Thus, according to non-limiting aspects, exemplary buffer amplifier can be configured to provide a single output signal (e.g., output signal 514) based on one or more signals (e.g., one or more signals 506) that correspond to a sensor signal change (e.g., a capacitance change) between the first portion (e.g., flexible diaphragm 108 or a portion thereof) and the second portion (e.g., perforated backplate 106 or a portion thereof) of the capacitive MEMS sensor (e.g., MEMS sensor device or microphone 100).

In a non-limiting aspect of exemplary systems, the one or more bias voltage generators (e.g., one or more of bias voltage generator 502 or bias voltage generator 512) can comprise a positive charge pump operatively coupled to the first portion (e.g., flexible diaphragm 108 or a portion thereof). In another non-limiting aspect of exemplary systems, the one or more bias voltage generators (e.g., one or more of bias voltage generator 502 or bias voltage generator 512) can further comprise a negative charge pump operatively coupled to the second portion (e.g., perforated backplate 106 or a portion thereof). In yet another non-limiting aspect, the input of the buffer amplifier can be operatively coupled to the positive charge pump and the first portion (e.g., flexible diaphragm 108 or a portion thereof) via a capacitor (e.g., capacitor 510). According to further non-limiting implementations, one or more of the one or more bias voltage generators (e.g., bias voltage generator 502) can be configured to provide a positive bias voltage within the range of about 9 to about 19.5 Volts (V), another of the one or more bias voltage generators (e.g., bias voltage generator 512) can be configured to provide a negative bias voltage within the range of about −15 to about −7.5 Volts (V), for example, as further described herein. In another non-limiting aspect, the positive bias voltage and the negative bias voltage provided by the one or more bias voltage generators (e.g., bias voltage generator 502, 512) can be maintained substantially equal in magnitude.

In other non-limiting implementations of exemplary systems, as described herein, exemplary ASIC (e.g., ASIC CMOS 104) can be further configured to operate one or more of the positive charge pump or the negative charge pump in one or more of a set of modes based on power consumption, sound pressure level, predetermined noise performance the MEMS microphone (e.g., MEMS sensor device or microphone 100), and/or other considerations, for example, as further described herein. As non-limiting examples, the one or more of the set of modes can comprise variation of one or more voltage associated with the one or more of the first bias voltage generator (e.g., bias voltage generator 502) or the second bias voltage generator (e.g., bias voltage generator 512) between zero and a maximum voltage level associated with the one or more of the first bias voltage generator (e.g., bias voltage generator 502) or the second bias voltage generator (e.g., bias voltage generator 512), for instance, as further described herein.

Figure 6:
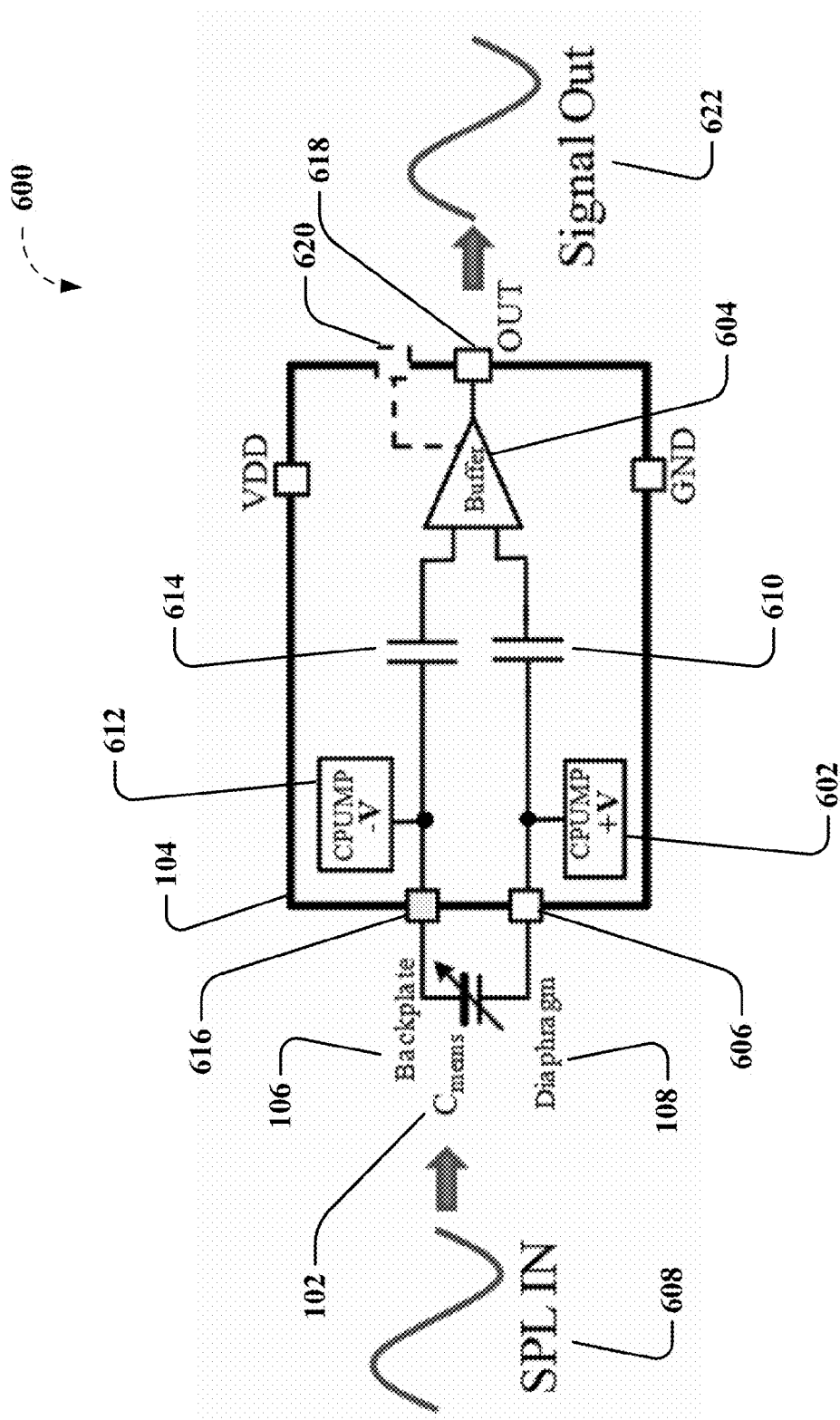
FIG. 6 depicts another exemplary circuit block diagram that illustrates further non-limiting MEMS sensor bias voltage techniques, according to still further embodiments described herein.

As depicted in FIG. 5, exemplary electronic circuitry 504 is shown comprising an exemplary buffer amplifier. However, further non-limiting implementations can employ a differential amplifier to facilitate increasing the immunity of the MEMS sensor device or microphone 100 for common-mode interference at the signal inputs of the differential amplifier. For example, FIG. 6 depicts another exemplary circuit block diagram 600 that illustrates further exemplary MEMS sensor bias voltage techniques, according to still further embodiments described herein. For instance, FIG. 6 depicts an exemplary circuit block diagram 600 that can comprise an exemplary ASIC CMOS 104. In a non-limiting aspect, ASIC CMOS 104 can be disposed in an exemplary microphone package (e.g., a package comprising lid or cover 112 and package substrate 114 associated with MEMS sensor device or microphone 100, etc.).

In a further non-limiting aspect, ASIC CMOS 104 can comprise one or more bias voltage generators. In exemplary ASIC CMOS 104 depicted in FIG. 6, ASIC CMOS 104 is depicted as comprising a first bias voltage generator 602. As further described above, first bias voltage generator 602 can be operatively coupled to a first portion (e.g., perforated backplate 106 or flexible diaphragm 108 or a portion thereof) of MEMS acoustic sensor or microphone element 102 and can be configured to provide a positive bias voltage to the first portion. In a non-limiting aspect, first bias voltage generator 602 can be operatively coupled to flexible diaphragm 108 of MEMS acoustic sensor or microphone element 102 and can be configured to provide a positive bias voltage to the flexible diaphragm 108. In a further non-limiting aspect, first bias voltage generator 602 can comprise a positive charge pump. As further described above, first bias voltage generator 602 can comprise other bias voltage generation circuitry, such as, some form of switched capacitor circuit, or otherwise, for example, available to one skilled in the art. In a non-limiting aspect, a positive $V_{bias}$ generated by first bias voltage generator 602 can comprise voltages many times greater than the applied $V_{dd}$ voltage. For example, exemplary first bias voltage generator 602 can be configured to provide a positive bias voltage within the range of about 9 to about 19.5 Volts (V).

As depicted in FIG. 6, ASIC CMOS 104 can further comprise or be associated with electronic circuitry 604. In a non-limiting aspect, ASIC CMOS 104 can be operatively coupled to MEMS acoustic sensor or microphone element 102. In a further non-limiting aspect, ASIC CMOS 104 can be configured to receive one or more first signals 606 that can correspond to acoustic waves or sound pressure 608 applied to flexible diaphragm 108. According to a further non-limiting aspect, exemplary first bias voltage generator 602 and the first portion (e.g., flexible diaphragm 108 or a portion thereof) can be operatively coupled to the electronic circuitry 604 via a capacitor 610. In exemplary implementations of ASIC CMOS 104, electronic circuitry 604 can comprise a differential amplifier, wherein a first input of the differential amplifier can be operatively coupled to the first portion (e.g., flexible diaphragm 108 or a portion thereof).

As further depicted in FIG. 6, exemplary ASIC CMOS 104 can further comprise second bias voltage generator 612. As further described above, second bias voltage generator 612 can be operatively coupled to a second portion (e.g., the other of the perforated backplate 106 or flexible diaphragm 108 or a portion thereof) of MEMS acoustic sensor or microphone element 102 and can be configured to provide a negative bias voltage to the second portion. In a non-limiting aspect, second bias voltage generator 612 can be operatively coupled to perforated backplate 106 of MEMS acoustic sensor or microphone element 102 and can be configured to provide a negative bias voltage to the perforated backplate 106. In a further non-limiting aspect, second bias voltage generator 612 can comprise a negative charge pump. As further described above, second bias voltage generator 612 can comprise other bias voltage generation circuitry, such as, some form of switched capacitor circuit, or otherwise, for example, available to one skilled in the art. For example, exemplary second bias voltage generator 612 can be configured to provide a negative bias voltage within the range of about −15 to about −7.5 V.

According to a further non-limiting aspect, exemplary second bias voltage generator 612 and the second portion (e.g., perforated backplate 106 or a portion thereof) can be operatively coupled to the electronic circuitry 604 via a capacitor 614. As described above, in exemplary implementations of ASIC CMOS 104, electronic circuitry 604 can comprise a differential amplifier, wherein a second input of the differential amplifier can be operatively coupled to the second portion (e.g., perforated backplate 106 or a portion thereof). As further described above, in a further non-limiting aspect, ASIC CMOS 104 can be configured to receive one or more second signals 616 that can correspond to or be associated with acoustic waves or sound pressure 608 applied to flexible diaphragm 108.

As a result of employing exemplary bias voltage generators 602 and 612, wherein the second bias voltage of second bias voltage generator 612 is of opposite polarity of the first bias voltage of first bias voltage generator 602, an effectively higher $V_{bias}$ can be applied to MEMS acoustic sensor or microphone element 102 due to the effective bias voltage between perforated backplate 106 and flexible diaphragm 108, being the sum of the magnitude of the two bias voltages. Note that exemplary bias voltage generators 602 and 612 can be maximized without resorting to higher breakdown voltage semiconductor processes. Accordingly, as described above, MEMS acoustic sensor or microphone element 102 designs can provide enhanced robustness to stiction by allowing for wider sense gap between the perforated backplate 106 and flexible diaphragm 108 and/or can provide MEMS acoustic sensor or microphone element 102 designs that can tolerate greater sound pressure levels, resulting in MEMS sensor devices or microphones 100 having higher dynamic range).

Accordingly, in a non-limiting aspect, an exemplary differential amplifier of electronic circuitry 604 can be configured to provide a single output signal 618 based on one or more first signals 606 that can correspond to acoustic waves or sound pressure 608 applied to flexible diaphragm 108. In another non-limiting aspect, exemplary differential amplifier of electronic circuitry 604 can be configured to provide a differential output comprising an output signal 618 and output signal 620 based on one or more first signals 606 and 616 that can correspond to or be associated with acoustic waves or sound pressure 608 applied to flexible diaphragm 108. Thus, as illustrated in FIG. 6, for a positive $V_{bias}$ applied to the flexible diaphragm 108, where acoustic waves or sound pressure 608 passes through the perforated backplate 106 to deflect the flexible diaphragm 108, a positive going pressure wave traveling through the perforated backplate 106 and deflecting the flexible diaphragm 108 away from the perforated backplate 106 will result in an decrease in the variable capacitance, which can result in a positive going output signal 622. Thus, as depicted in FIG. 6, exemplary embodiments of the disclosed subject matter employing various aspects of circuit block diagram 600 can facilitate providing a generated output signal 622 that is not inverted, is in phase, or is of matching polarity with a positive going pressure wave of acoustic waves or sound pressure 608, while facilitating increased sensitivity and/or robustness of MEMS acoustic sensor or microphone element 102, without resorting to higher breakdown voltage semiconductor processes, while providing improved common mode rejection because of differential input associated with exemplary differential amplifier of electronic circuitry 604 and/or while providing improved SPL capability (e.g., improved dynamic range), because of potential differential output capability associated with differential output of ASIC CMOS 104 comprising output signal 618 and output signal 620.

According to further non-limiting aspects of the disclosed subject matter, various embodiments of exemplary ASIC CMOS 104 can be configured to operate one or more of a first bias voltage generator (e.g., first bias voltage generator 502, 602, etc.) or a second bias voltage generator (e.g., second bias voltage generator 512, 612, etc.) in one or more of a set of modes based on one or more of power consumption, sound pressure level, or predetermined noise performance the MEMS microphone, or other considerations, and so on. As non-limiting example, an exemplary set of modes can comprise variation of one or more voltage associated with the first bias voltage generator (e.g., first bias voltage generator 502, 602, etc.) or the second bias voltage generator (e.g., second bias voltage generator 512, 612, etc.) between zero and a maximum voltage level associated with the first bias voltage generator (e.g., first bias voltage generator 502, 602) or the second bias voltage generator (e.g., second bias voltage generator 512, 612), as further described herein. It can be understood that the one or more of a set of modes as described herein can include other modes of operation including, but not limited to, such modes as bias voltage generators switched on, switched off, and so on, whether operated intermittently, periodically, or otherwise, etc.

Accordingly, various non-limiting implementations of the disclosed subject matter can provide exemplary ASIC CMOS 104 that can be configured to operate one or more of a first bias voltage generator (e.g., first bias voltage generator 502, 602, etc.) or a second bias voltage generator (e.g., second bias voltage generator 512, 612, etc.) in one or more of a set of modes based on trigger events as identified in the considerations herein (e.g., based on one or more of power consumption, sound pressure level, or predetermined noise performance the MEMS microphone, or other considerations, and so on), or otherwise. As a non-limiting example, exemplary ASIC CMOS 104 can be configured to facilitate identification or determination of one or more trigger events, setting one or more modes (e.g., on, off, variation of voltage level, etc.) of the first bias voltage generator (e.g., first bias voltage generator 502, 602) or the second bias voltage generator (e.g., second bias voltage generator 512, 612), as further described herein, and/or returning to a normal or other operating mode, upon identification or determination of the end of one or more trigger events, identification or determination of one or more other trigger events, and so on, without limitation.

Accordingly, various non-limiting implementations of the disclosed subject matter provide exemplary MEMS microphones (e.g., MEMS sensor device or microphone 100), comprising a MEMS microphone element (e.g., MEMS acoustic sensor or microphone element 102) comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), as described above regarding FIGS. 1 and 6.

In a non-limiting aspect, exemplary MEMS microphones (e.g., MEMS sensor device or microphone 100) can further comprise an ASIC (e.g., ASIC CMOS 104) disposed in the microphone package (e.g., a package comprising lid or cover 112 and package substrate 114 associated with MEMS sensor device or microphone 100, etc.) comprising a first bias voltage generator (e.g., bias voltage generator 602) and a second bias voltage generator (e.g., bias voltage generator 612). In a further non-limiting aspect, exemplary first bias voltage generator (e.g., bias voltage generator 602) can be operatively coupled to the diaphragm (e.g., flexible diaphragm 108 or a portion thereof) and can be configured to provide a first bias voltage to the diaphragm (e.g., flexible diaphragm 108). In another non-limiting aspect, and exemplary second bias voltage generator (e.g., bias voltage generator 612) can be operatively coupled to the backplate (e.g., perforated backplate 106 or a portion thereof) and can be configured to provide a second bias voltage to the backplate (e.g., perforated backplate 106), wherein the second bias voltage can be of opposite polarity of the first bias voltage, according non-limiting aspects.

In non-limiting embodiments, an exemplary first bias voltage can be of positive polarity and exemplary second bias voltage can be of negative polarity, as further described herein. In other non-limiting embodiments, exemplary first bias voltage generator (e.g., bias voltage generator 602) can comprise a positive charge pump and/or exemplary second bias voltage generator (e.g., bias voltage generator 612) can comprise a negative charge pump. In still other non-limiting examples, exemplary first bias voltage generator (e.g., bias voltage generator 602) can be configured to provide the positive bias voltage within the range of about 9 to about 19.5 Volts (V), and exemplary second bias voltage generator (e.g., bias voltage generator 612) can be configured to provide the negative bias voltage within the range of about −15 to about −7.5 Volts (V), for example, as further described herein. In another non-limiting aspect, exemplary first bias voltage (e.g., via bias voltage generator 602) and exemplary second bias voltage (e.g. via bias voltage generator 612) can be maintained substantially equal in magnitude. In yet another non-limiting aspect, exemplary first bias voltage (e.g., via bias voltage generator 602) and exemplary second bias voltage (e.g. via bias voltage generator 612) can be maintained such that the one or more signals (e.g., one or more of the one or more first signals 606 or the one or more second signals 616) associated with the diaphragm (e.g., flexible diaphragm 108) and the backplate (e.g., perforated backplate 106) are not distorted (e.g., clipped, one prematurely clipped relative to the other, etc.).

In non-limiting embodiments, an exemplary ASIC (e.g., ASIC CMOS 104) can further comprise electronic circuitry (e.g., electronic circuitry 604 comprising a differential amplifier), as described above. Accordingly, exemplary ASIC (e.g., ASIC CMOS 104) can further comprise electronic circuitry (e.g., electronic circuitry 604 comprising a differential amplifier), wherein a first input of the differential amplifier can be operatively coupled to the diaphragm (e.g., flexible diaphragm 108 or a portion thereof) via a first capacitor (e.g., capacitor 610), and wherein a second input of the differential amplifier can be operatively coupled to the backplate (e.g., perforated backplate 106 or a portion thereof) via a second capacitor (e.g., capacitor 614). Accordingly, in yet other non-limiting implementations, exemplary electronic circuitry (e.g., electronic circuitry 604 comprising a differential amplifier) can be configured to receive one or more signals (e.g., one or more of the one or more first signals 606 or the one or more second signals 616) that correspond to a sound pressure (e.g., acoustic waves or sound pressure 608) applied to the diaphragm (e.g., flexible diaphragm 108). In an aspect, exemplary differential amplifier can be configured to reject common-mode signals between the (e.g., perforated backplate 106) and the diaphragm (e.g., flexible diaphragm 108). Thus, according to non-limiting aspects, exemplary differential amplifier can be configured to provide a single output signal (e.g., output signal 618) or a differential output signal (e.g., differential output of ASIC CMOS 104 comprising output signal 618 and output signal 620) based on the one or more signals (e.g., one or more of the one or more first signals 606 or the one or more second signals 616) that correspond to the sound pressure (e.g., acoustic waves or sound pressure 608) applied to the diaphragm (e.g., flexible diaphragm 108).

In still other non-limiting aspects, exemplary ASIC (e.g., ASIC CMOS 104) can be further configured to operate one or more of the first bias voltage generator (e.g., bias voltage generator 602) or the second bias voltage generator (e.g., bias voltage generator 612) in one or more of a set of modes based on power consumption, sound pressure level, predetermined noise performance the MEMS microphone (e.g., MEMS sensor device or microphone 100), and/or other considerations, for example, as further described herein. In still another non-limiting aspect, one or more of the exemplary set of modes can comprise variation of one or more voltage associated with the one or more of the first bias voltage generator (e.g., bias voltage generator 602) or the second bias voltage generator (e.g., bias voltage generator 612) between zero and a maximum voltage level associated with the one or more of the first bias voltage generator (e.g., bias voltage generator 602) or the second bias voltage generator (e.g., bias voltage generator 612).

Further non-limiting implementations of the disclosed subject matter provide exemplary systems, directed to exemplary capacitive MEMS sensors (e.g., MEMS sensor device or microphone 100. In a non-limiting aspect, exemplary capacitive MEMS sensors can comprise a diaphragm (e.g., flexible diaphragm 108) and a backplate (e.g., perforated backplate 106) of an exemplary MEMS acoustic sensor or microphone element 102 disposed in a microphone package (e.g., a package comprising lid or cover 112 and package substrate 114 associated with MEMS sensor device or microphone 100, etc.), for example, as described above regarding FIGS. 1 and 6. As further described above regarding FIGS. 1 and 6, exemplary systems can comprise a first portion (e.g., flexible diaphragm 108 or a portion thereof) of a capacitive MEMS sensor (e.g., MEMS sensor device or microphone 100) and a second portion (e.g., perforated backplate 106 or a portion thereof) of the capacitive MEMS sensor (e.g., MEMS sensor device or microphone 100). In non-limiting aspects, the first portion (e.g., flexible diaphragm 108 or a portion thereof) can comprise a diaphragm (e.g., flexible diaphragm 108) of a MEMS microphone and/or the second portion (e.g., perforated backplate 106 or a portion thereof) can comprise a backplate (e.g., perforated backplate 106) of the MEMS microphone (e.g., MEMS sensor device or microphone 100).

Exemplary systems can further comprise an ASIC (e.g., ASIC CMOS 104) associated with the capacitive MEMS sensor (e.g., MEMS sensor device or microphone 100) comprising a differential amplifier (e.g., differential amplifier associated with electronic circuitry 604) and one or more bias voltage generators (e.g., one or more of bias voltage generator 602 or bias voltage generator 612). As non-limiting examples, a first input of the differential amplifier can be operatively coupled to the first portion (e.g., flexible diaphragm 108 or a portion thereof) of the capacitive MEMS sensor (e.g., MEMS sensor device or microphone 100), and/or a second input of the differential amplifier can be operatively coupled to the second portion (e.g., perforated backplate 106 or a portion thereof) of the capacitive MEMS sensor (e.g., MEMS sensor device or microphone 100). Accordingly, in yet other non-limiting implementations, exemplary electronic circuitry (e.g., electronic circuitry 604 comprising a differential amplifier) can be configured to receive one or more signals (e.g., one or more of the one or more first signals 606 or the one or more second signals 616) that correspond to a sound pressure (e.g., acoustic waves or sound pressure 608) applied to the diaphragm (e.g., flexible diaphragm 108).

In an aspect, exemplary differential amplifier can be configured to reject common-mode signals between the (e.g., perforated backplate 106) and the diaphragm (e.g., flexible diaphragm 108). Thus, according to non-limiting aspects, exemplary differential amplifier can be configured to provide one or more of a single output signal (e.g., output signal 618) or a differential output signal (e.g., differential output of ASIC CMOS 104 comprising output signal 618 and output signal 620) based on one or more signals (e.g., one or more of the one or more first signals 606 or the one or more second signals 616) that correspond to a sensor signal change (e.g., a capacitance change) between the first portion (e.g., flexible diaphragm 108 or a portion thereof) and the second portion (e.g., perforated backplate 106 or a portion thereof) of the capacitive MEMS sensor (e.g., MEMS sensor device or microphone 100).

In a non-limiting aspect of exemplary systems, the one or more bias voltage generators (e.g., one or more of bias voltage generator 602 or bias voltage generator 612) can comprise a positive charge pump operatively coupled to the first portion (e.g., flexible diaphragm 108 or a portion thereof). In another non-limiting aspect of exemplary systems, the one or more bias voltage generators (e.g., one or more of bias voltage generator 602 or bias voltage generator 612) can further comprise a negative charge pump operatively coupled to the second portion (e.g., perforated backplate 106 or a portion thereof). In yet another non-limiting aspect, the first input of the differential amplifier can be operatively coupled to the diaphragm (e.g., flexible diaphragm 108 or a portion thereof) via a first capacitor (e.g., capacitor 610), and the second input of the differential amplifier can be operatively coupled to the backplate (e.g., perforated backplate 106 or a portion thereof) via a second capacitor (e.g., capacitor 614).

According to further non-limiting implementations, one or more of the one or more bias voltage generators (e.g., bias voltage generator 602) can be configured to provide a positive bias voltage within the range of about 9 to about 19.5 Volts (V), another of the one or more bias voltage generators (e.g., bias voltage generator 612) can be configured to provide a negative bias voltage within the range of about −15 to about −7.5 Volts (V), for example, as further described herein. In another non-limiting aspect, the positive bias voltage and the negative bias voltage provided by the one or more bias voltage generators (e.g., bias voltage generator 602, 612) can be maintained substantially equal in magnitude.

In other non-limiting implementations of exemplary systems, as described herein, exemplary ASIC (e.g., ASIC CMOS 104) can be further configured to operate one or more of the positive charge pump or the negative charge pump in one or more of a set of modes based on power consumption, sound pressure level, predetermined noise performance the MEMS microphone (e.g., MEMS sensor device or microphone 100), and/or other considerations, for example, as further described herein. As non-limiting examples, the one or more of the set of modes can comprise variation of one or more voltage associated with the one or more of the first bias voltage generator (e.g., bias voltage generator 602) or the second bias voltage generator (e.g., bias voltage generator 612) between zero and a maximum voltage level associated with the one or more of the first bias voltage generator (e.g., bias voltage generator 602) or the second bias voltage generator (e.g., bias voltage generator 612), for instance, as further described herein.

Figure 7:
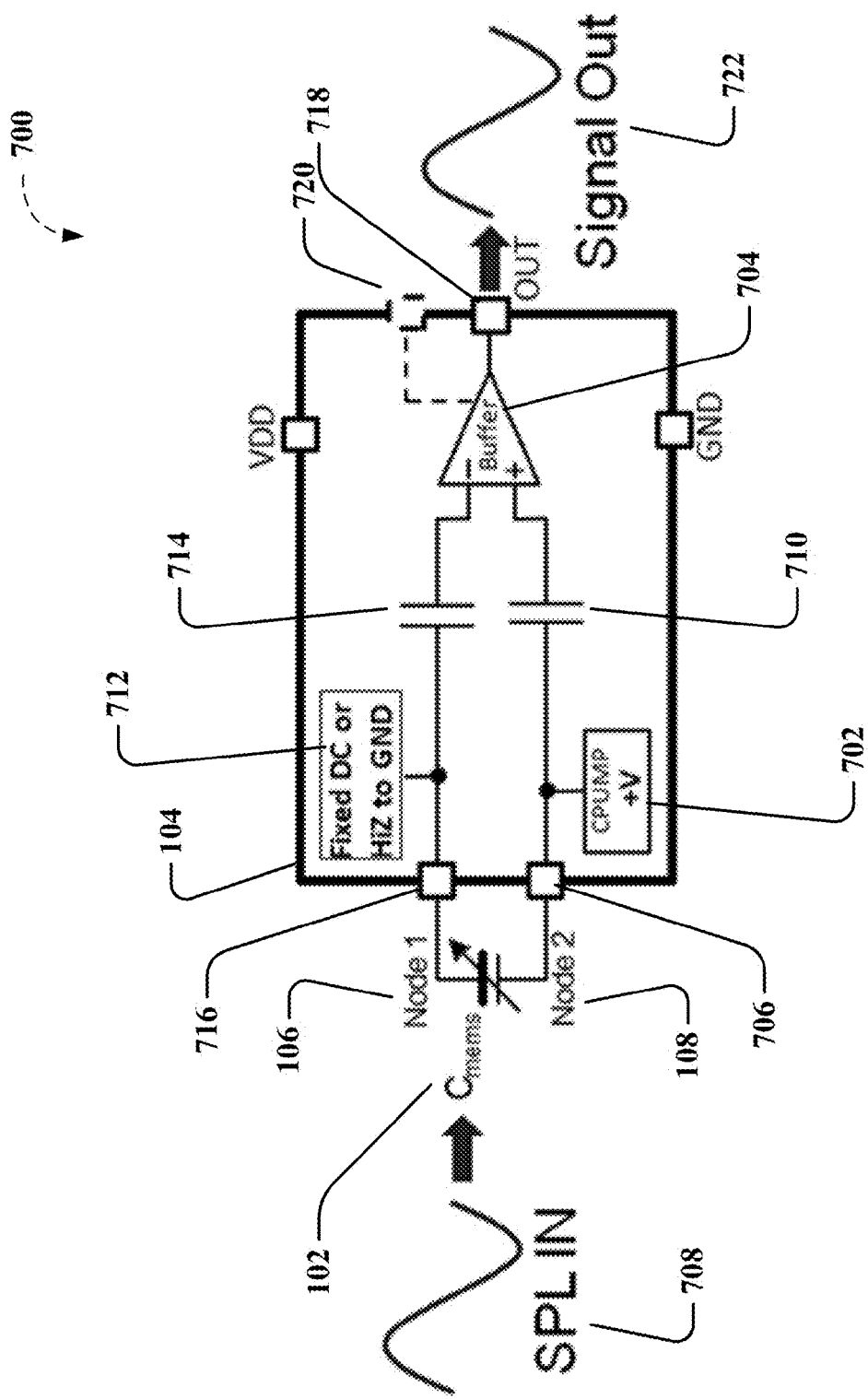
FIG. 7 depicts a further exemplary circuit block diagram that illustrates other exemplary MEMS sensor bias voltage techniques, according to still further embodiments described herein.

FIG. 7 depicts a further exemplary circuit block diagram 700 that illustrates other exemplary MEMS sensor bias voltage techniques, according to still further embodiments described herein. For example, FIG. 7 depicts an exemplary circuit block diagram 700 that can comprise an exemplary ASIC CMOS 104. In a non-limiting aspect, ASIC CMOS 104 can be disposed in an exemplary microphone package (e.g., a package comprising lid or cover 112 and package substrate 114 associated with MEMS sensor device or microphone 100, etc.). In a further non-limiting aspect, ASIC CMOS 104 can comprise one or more bias voltage generators. In exemplary ASIC CMOS 104 depicted in FIG. 7, ASIC CMOS 104 is depicted as comprising bias voltage generator 702. As further described above, bias voltage generator 702 can be operatively coupled to a first portion (e.g., Node 2 comprising perforated backplate 106 or flexible diaphragm 108 or a portion thereof) of MEMS acoustic sensor or microphone element 102 and can be configured to provide a positive bias voltage to the first portion. In a non-limiting aspect, bias voltage generator 702 can be operatively coupled to flexible diaphragm 108 of MEMS acoustic sensor or microphone element 102 and can be configured to provide a positive bias voltage to the flexible diaphragm 108. In a further non-limiting aspect, bias voltage generator 702 can comprise a positive charge pump. As further described above, bias voltage generator 702 can comprise other bias voltage generation circuitry, such as, some form of switched capacitor circuit, or otherwise, for example, available to one skilled in the art. In a non-limiting aspect, a positive $V_{bias}$ generated by bias voltage generator 702 can comprise voltages many times greater than the applied $V_{dd}$ voltage. For example, exemplary bias voltage generator 702 can be configured to provide a positive bias voltage within the range of about 9 to about 19.5 Volts (V).

As depicted in FIG. 7, ASIC CMOS 104 can further comprise or be associated with electronic circuitry 704. In a non-limiting aspect, ASIC CMOS 104 can be operatively coupled to MEMS acoustic sensor or microphone element 102. In a further non-limiting aspect, ASIC CMOS 104 can be configured to receive one or more first signals 706 that can correspond to acoustic waves or sound pressure 708 applied to flexible diaphragm 108. According to a further non-limiting aspect, exemplary bias voltage generator 702 and the first portion (e.g., flexible diaphragm 108 or a portion thereof) can be operatively coupled to the electronic circuitry 704 via a capacitor 710. In exemplary implementations of ASIC CMOS 104, electronic circuitry 704 can comprise a differential amplifier, wherein a first input of the differential amplifier can be operatively coupled to the first portion (e.g., flexible diaphragm 108 or a portion thereof), according to a non-limiting aspect.

In contrast to exemplary circuit block diagram 600 of FIG. 6 comprising a second bias voltage generator 612, exemplary circuit block diagram 700 of FIG. 7 depicts a second portion (e.g., Node 1 comprising the other of perforated backplate 106 or flexible diaphragm 108) of MEMS acoustic sensor or microphone element 102 operatively coupled to a fixed DC potential or a high impedance connection to ground 712. In a non-limiting aspect, fixed DC potential or high impedance connection to ground 712 can be operatively coupled to perforated backplate 106 of MEMS acoustic sensor or microphone element 102. In another non-limiting aspect, the perforated backplate 106 can be operatively coupled to ground. According to a further non-limiting aspect, fixed DC potential or a high impedance connection to ground 712 and the second portion (e.g., perforated backplate 106 or a portion thereof) can be operatively coupled to the electronic circuitry 704 via a capacitor 714.

As further described above, in exemplary implementations of ASIC CMOS 104, electronic circuitry 704 can comprise a differential amplifier, wherein a second input of the differential amplifier can be operatively coupled to the second portion (e.g., perforated backplate 106 or a portion thereof). As further described above, in a further non-limiting aspect, ASIC CMOS 104 can be configured to receive one or more second signals 716 that can correspond to or be associated with acoustic waves or sound pressure 708 applied to flexible diaphragm 108.

As a result of employing exemplary bias voltage generator 702 and fixed DC potential or a high impedance connection to ground 712 in exemplary circuit block diagram 700 of FIG. 7 instead of a second bias voltage generator 612 as in exemplary circuit block diagram 600 of FIG. 6 comprising, ASIC CMOS 104 depicted in exemplary circuit block diagram 700 can provide reduced complexity, cost, and/or power consumption, while facilitating improved common mode rejection because of differential input associated with exemplary differential amplifier of electronic circuitry 704 and/or while providing improved SPL capability (e.g., improved dynamic range), because of differential output capability associated with differential output of ASIC CMOS 104. It can be understood that an exemplary fixed DC potential of the fixed DC potential or a high impedance connection to ground 712, as described herein, can comprise a fixed DC potential of any predetermined value within the range allowed by techniques available to one skilled in the art, e.g., as limited by the breakdown voltage of conventional semiconductor processes.

Accordingly, in a non-limiting aspect, an exemplary differential amplifier of electronic circuitry 704 can be configured to provide a single output signal 718 based on one or more first signals 706 that can correspond to acoustic waves or sound pressure 708 applied to flexible diaphragm 108. In another non-limiting aspect, exemplary differential amplifier of electronic circuitry 704 can be configured to provide a differential output comprising an output signal 718 and output signal 720 based on one or more first signals 706 and 716 that can correspond to or be associated with acoustic waves or sound pressure 708 applied to flexible diaphragm 108. Thus, as illustrated in FIG. 7, for a positive $V_{bias}$ applied to Node 2 (e.g., comprising flexible diaphragm 108 or perforated backplate 106 or a portion thereof) comprising flexible diaphragm 108, where acoustic waves or sound pressure 708 passes through the perforated backplate 106 to deflect the flexible diaphragm 108, a positive going pressure wave traveling through the perforated backplate 106 and deflecting the flexible diaphragm 108 away from the perforated backplate 106 will result in an decrease in the variable capacitance, which can result in a positive going output signal 722. Thus, as depicted in FIG. 7, exemplary embodiments of the disclosed subject matter employing various aspects of circuit block diagram 700 can facilitate providing a generated output signal 722 that is not inverted, is in phase, or is of matching polarity with a positive going pressure wave of acoustic waves or sound pressure 708, while providing improved common mode rejection because of differential input associated with exemplary differential amplifier of electronic circuitry 704 and/or while providing improved SPL capability (e.g., improved dynamic range), because of potential differential output capability associated with differential output of ASIC CMOS 104 comprising output signal 718 and output signal 720.

Accordingly, various non-limiting implementations of the disclosed subject matter provide exemplary MEMS microphones (e.g., MEMS sensor device or microphone 100), comprising a MEMS microphone element (e.g., MEMS acoustic sensor or microphone element 102) comprising a diaphragm (e.g., flexible diaphragm 108) and a backplate (e.g., perforated backplate 106) disposed in a microphone package (e.g., a package comprising lid or cover 112 and package substrate 114 associated with MEMS sensor device or microphone 100, etc.), as described above regarding FIGS. 1 and 7.

In a non-limiting aspect, exemplary MEMS microphones (e.g., MEMS sensor device or microphone 100) can further comprise an ASIC (e.g., ASIC CMOS 104) disposed in the microphone package (e.g., a package comprising lid or cover 112 and package substrate 114 associated with MEMS sensor device or microphone 100, etc.) comprising a first bias voltage generator (e.g., bias voltage generator 702). In a further non-limiting aspect, exemplary ASIC (e.g., ASIC CMOS 104) can further comprise one of more of a second bias voltage generator (not shown) or a fixed DC potential or high impedance connection to ground 712. In other non-limiting implementations, exemplary first bias voltage generator (e.g., bias voltage generator 702) can be operatively coupled to the diaphragm (e.g., flexible diaphragm 108 or a portion thereof) and can be configured to provide a first bias voltage to the diaphragm (e.g., flexible diaphragm 108). In still other non-limiting implementations, the one of more second bias voltage generator (not shown) or a fixed DC potential or high impedance connection to ground 712 can be operatively coupled to the backplate (e.g., perforated backplate 106 or a portion thereof) and can be configured to provide a second bias voltage to the backplate (e.g., perforated backplate 106), wherein the second bias voltage can be of opposite polarity of the first bias voltage, or can be configured to provide a fixed DC potential or high impedance connection to ground 712. As described above, in non-limiting embodiments, an exemplary first bias voltage can be of positive polarity and exemplary second bias voltage can be of negative polarity, as further described herein, whereas a fixed DC potential or high impedance connection to ground 712 can facilitate operatively coupling the backplate (e.g., perforated backplate 106 or a portion thereof) to a second input of an exemplary differential amplifier as described herein.

In other non-limiting embodiments, exemplary first bias voltage generator (e.g., bias voltage generator 702) can comprise a positive charge pump and/or exemplary second bias voltage generator (not shown) can comprise a negative charge pump. In still other non-limiting examples, exemplary first bias voltage generator (e.g., bias voltage generator 702) can be configured to provide the positive bias voltage within the range of about 9 to about 19.5 Volts (V), and exemplary second bias voltage generator (not shown) can be configured to provide the negative bias voltage within the range of about −15 to about −7.5 Volts (V), for example, as further described herein. In other non-limiting implementation, second portion (e.g., Node 1 comprising the other of perforated backplate 106 or flexible diaphragm 108 or a portion thereof) can be operatively coupled to a fixed DC potential or high impedance connection to ground 712. In another non-limiting aspect, exemplary first bias voltage (e.g., via bias voltage generator 702) and exemplary second bias voltage (not shown) can be maintained substantially equal in magnitude or a fixed DC potential or high impedance connection to ground 712 can be provided.

For other non-limiting embodiments, an exemplary ASIC (e.g., ASIC CMOS 104) can further comprise electronic circuitry (e.g., electronic circuitry 704 comprising a differential amplifier), as described above. Thus, in an aspect, exemplary electronic circuitry (e.g., electronic circuitry 704 comprising a differential amplifier) can comprise a differential amplifier, wherein a first input of the differential amplifier can be operatively coupled to the diaphragm (e.g., flexible diaphragm 108 or a portion thereof) via a first capacitor (e.g., capacitor 710), and wherein a second input of the differential amplifier can be operatively coupled to the backplate (e.g., perforated backplate 106 or a portion thereof) via a second capacitor (e.g., capacitor 714). Accordingly, in yet other non-limiting implementations, exemplary electronic circuitry (e.g., electronic circuitry 704 comprising a differential amplifier) can be configured to receive one or more signals (e.g., one or more of the one or more first signals 706 or the more second signals 716) that correspond to a sound pressure (e.g., acoustic waves or sound pressure 708) applied to the diaphragm (e.g., flexible diaphragm 108). In an aspect, exemplary differential amplifier can be configured to reject common-mode signals between the first portion (e.g., Node 2 comprising perforated backplate 106 or flexible diaphragm 108 or a portion thereof) and the second portion (e.g., Node 1 comprising the other of perforated backplate 106 or flexible diaphragm 108 or a portion thereof). Thus, according to non-limiting aspects, exemplary differential amplifier can be configured to provide a single output signal (e.g., output signal 718) or a differential output signal (e.g., differential output of ASIC CMOS 104 comprising output signal 718 and output signal 720) based on the one or more signals (e.g., one or more of the one or more first signals 706 or the more second signals 716) that correspond to the sound pressure (e.g., acoustic waves or sound pressure 708) applied to the diaphragm (e.g., flexible diaphragm 108).

Further non-limiting implementations of the disclosed subject matter provide exemplary systems, directed to exemplary capacitive MEMS sensors (e.g., MEMS sensor device or microphone 100. In a non-limiting aspect, exemplary capacitive MEMS sensors can comprise a diaphragm (e.g., flexible diaphragm 108) and a backplate (e.g., perforated backplate 106) of an exemplary MEMS acoustic sensor or microphone element 102 disposed in a microphone package (e.g., a package comprising lid or cover 112 and package substrate 114 associated with MEMS sensor device or microphone 100, etc.), for example, as described above regarding FIGS. 1 and 7. As further described above regarding FIGS. 1 and 7, exemplary systems can comprise a first portion (e.g., Node 2 comprising perforated backplate 106 or flexible diaphragm 108 or a portion thereof) of a capacitive MEMS sensor (e.g., MEMS sensor device or microphone 100) (e.g., MEMS sensor device or microphone 100 and a second portion (e.g., Node 1 comprising the other of perforated backplate 106 or flexible diaphragm 108 or a portion thereof) of the capacitive MEMS sensor (e.g., MEMS sensor device or microphone 100). According to non-limiting implementations, the first portion (e.g., Node 2 comprising perforated backplate 106 or flexible diaphragm 108 or a portion thereof) can comprise a diaphragm (e.g., flexible diaphragm 108) of a MEMS microphone, and wherein the second portion (e.g., Node 1 comprising the other of perforated backplate 106 or flexible diaphragm 108 or a portion thereof) can comprise a backplate (e.g., perforated backplate 106) of the MEMS microphone (e.g., MEMS sensor device or microphone 100). In non-limiting aspects, the first portion (e.g., Node 2 comprising perforated backplate 106 or flexible diaphragm 108 or a portion thereof) can comprise a diaphragm (e.g., flexible diaphragm 108) of a MEMS microphone and/or the second portion (e.g., Node 1 comprising the other of perforated backplate 106 or flexible diaphragm 108 or a portion thereof) can comprise a backplate (e.g., perforated backplate 106) of the MEMS microphone.

Exemplary systems can further comprise an ASIC (e.g., ASIC CMOS 104) associated with the capacitive MEMS sensor (e.g., MEMS sensor device or microphone 100) comprising a differential amplifier (e.g., differential amplifier associated with electronic circuitry 704) and one or more bias voltage generators (e.g., bias voltage generator 702). As non-limiting examples, a first input of the differential amplifier can be operatively coupled to the first portion (e.g., Node 2 comprising perforated backplate 106 or flexible diaphragm 108 or a portion thereof) of the capacitive MEMS sensor (e.g., MEMS sensor device or microphone 100), and/or a second input of the differential amplifier can be operatively coupled to the second portion (e.g., Node 1 comprising the other of perforated backplate 106 or flexible diaphragm 108 or a portion thereof) of the capacitive MEMS sensor (e.g., MEMS sensor device or microphone 100). Accordingly, in yet other non-limiting implementations, exemplary electronic circuitry (e.g., electronic circuitry 704 comprising a differential amplifier) can be configured to receive one or more signals (e.g., one or more of the one or more first signals 706 or the more second signals 716) that correspond to a sound pressure (e.g., acoustic waves or sound pressure 708) applied to the diaphragm (e.g., flexible diaphragm 108). In an aspect, exemplary differential amplifier can be configured to reject common-mode signals between the first portion (e.g., Node 2 comprising perforated backplate 106 or flexible diaphragm 108 or a portion thereof) and the second portion (e.g., Node 1 comprising the other of perforated backplate 106 or flexible diaphragm 108 or a portion thereof). Thus, according to non-limiting aspects, exemplary differential amplifier can be configured to provide one or more of a single output signal (e.g., output signal 718) or a differential output signal (e.g., differential output of ASIC CMOS 104 comprising output signal 718 and output signal 720) based on one or more signals (e.g., one or more of the one or more first signals 706 or the more second signals 716) that correspond to a sensor signal change (e.g., a capacitance change) between the first portion (e.g., Node 2 comprising perforated backplate 106 or flexible diaphragm 108 or a portion thereof) and the second portion (e.g., Node 1 comprising the other of perforated backplate 106 or flexible diaphragm 108 or a portion thereof) of the capacitive MEMS sensor (e.g., MEMS sensor device or microphone 100).

In a non-limiting aspect of exemplary systems, the one or more bias voltage generators (e.g., bias voltage generator 702) can comprise a positive charge pump operatively coupled to the first portion (e.g., Node 2 comprising perforated backplate 106 or flexible diaphragm 108 or a portion thereof). In another non-limiting aspect of exemplary systems, the second portion (e.g., Node 1 comprising the other of perforated backplate 106 or flexible diaphragm 108 or a portion thereof) can be operatively coupled to a fixed DC potential or a high impedance connection to ground 712, as further described herein. In yet another non-limiting aspect, the first input of the differential amplifier can be operatively coupled to the first portion (e.g., Node 2 comprising perforated backplate 106 or flexible diaphragm 108 or a portion thereof) via a first capacitor (e.g., capacitor 710), and the second input of the differential amplifier can be operatively coupled to the second portion (e.g., Node 1 comprising the other of perforated backplate 106 or flexible diaphragm 108 or a portion thereof) via a second capacitor (e.g., capacitor 714). According to further non-limiting implementations, one or more of the one or more bias voltage generators (e.g., bias voltage generator 702) can be configured to provide a positive bias voltage within the range of about 9 to about 19.5 Volts (V), another of the one or more bias voltage generators (not shown) can be configured to provide a negative bias voltage within the range of about −15 to about −7.5 Volts (V), for example, as further described herein. In other non-limiting implementation, second portion (e.g., Node 1 comprising the other of perforated backplate 106 or flexible diaphragm 108 or a portion thereof) can be operatively coupled to a fixed DC potential or high impedance connection to ground 712. In another non-limiting aspect, exemplary first bias voltage (e.g., via bias voltage generator 702) and exemplary second bias voltage (not shown) can be maintained substantially equal in magnitude or a fixed DC potential or high impedance connection to ground 712 can be provided.

While, for the purposes of illustration, and not limitation, various non-limiting implementations of the disclosed subject matter are described herein in reference to exemplary non-limiting embodiments of MEMS sensor device or microphone 100, MEMS acoustic sensor or microphone element 102, and/or ASIC CMOS 104, or portions thereof, and so on, it can be understood that variations of the disclosed subject matter are possible within the scope of claims appended to the subject matter disclosed herein. For instance, it can be understood that various aspects as described herein, regarding FIGS. 3-7, for example, can be employed in implementations of a MEMS sensor device or microphone where sound pressure entering the MEMS microphone package via a port can directly impinge the diaphragm opposite the backplate. As non-limiting examples, implementations of a MEMS sensor device or microphone, where sound pressure entering the MEMS microphone package via a port can directly impinge the diaphragm opposite the backplate, can employ various aspects as described herein, regarding FIGS. 6-7, for example, by reversing the polarity and/or connections to the diaphragm and backplate of associated bias voltage generators, and/or employing the differential amplifier structures associated with electronic circuitry 604/704. As further non-limiting examples, it is noted that in various aspects as described herein, regarding FIGS. 6-7, for example, the disclosed subject matter can facilitate reversing the polarity and/or connections to the diaphragm and backplate of associated bias voltage generators, which can reverse polarity of the resultant signals, and/or employing differential amplifier structures associated with electronic circuitry 604/704, which can abrogate such considerations of polarity of the resultant signals. Moreover, while various references are made herein to a differential amplifier, it can be understood that an exemplary differential amplifier can comprise an arrangement of multiple single-ended amplifiers as understood by one having skill in the art.

In addition, while various non-limiting embodiments are described herein in reference to exemplary MEMS sensor devices or microphones for the purposes of understanding, the scope of claims appended to the subject matter disclosed herein are not so limited. In a non-limiting example, it can be understood that various aspects as described herein, regarding FIGS. 3-7, for example, can be employed in implementations of other MEMS sensors or devices that rely on capacitive sensing elements (e.g., pressure sensors, differential pressure sensors, ultrasound sensors, etc.) and/or may have application in other MEMS sensor devices employing other sensing elements (e.g., optical sensing elements, piezoelectric sensing elements, etc.). Furthermore, while references may be made or be implicit in various contexts to a signal or signals comprising a voltage signal or signals, or otherwise, for the purposes of understanding, the scope of claims appended to the subject matter disclosed herein are not so limited. Thus, various aspects as described herein, regarding FIGS. 3-7, for example, may be employed in other contexts not employing a voltage signal but rather another signal (e.g., a current signal, and optical signal, etc.).

Moreover, while various non-limiting embodiments are described herein in reference to a sensor signal change, such as a capacitance change, associated with a MEMS sensor or device, for the purposes of understanding, the scope of claims appended to the subject matter disclosed herein are not so limited. In another non-limiting example, it can be understood that various aspects as described herein, regarding FIGS. 3-7, for example, can be employed in implementations of other MEMS sensors or devices that may employ techniques to hold various sensor signals constant (e.g., constant current, constant voltage, etc.), while detecting another signal closely associated with a sensor parameter change via the techniques employed. In other words, various aspects as described herein, regarding FIGS. 3-7, for example, may be employed in other implementations of other MEMS sensors or devices that may not require or employ a sensor signal change, a capacitance change, etc., as described herein.

In view of the subject matter described supra, methods that can be implemented in accordance with the disclosed subject matter will be better appreciated with reference to the flowcharts of FIGS. 8-12. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and/orders of the blocks, can be implemented which achieve the same or a similar result. Moreover, not all illustrated blocks may be required to implement the methods described hereinafter.

Exemplary Methods

Figure 8:
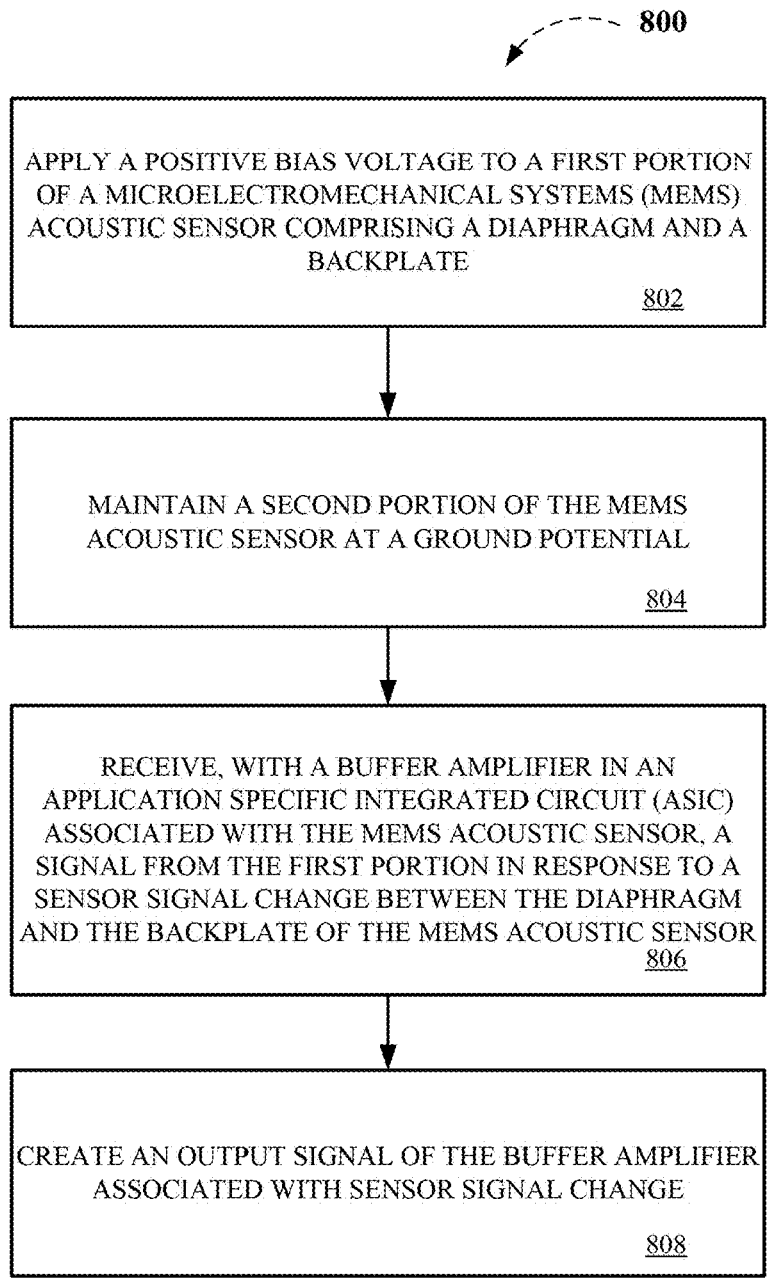
FIG. 8 depicts an exemplary flowchart of non-limiting methods associated with exemplary bias voltages for a MEMS sensor or microphone, according to various non-limiting aspects of the disclosed subject matter.

FIG. 8 depicts an exemplary flowchart of non-limiting methods 800 associated with exemplary bias voltages for a MEMS sensor or microphone, according to various non-limiting aspects of the disclosed subject matter. Accordingly, various non-limiting implementations of exemplary methods 800, as described herein, can comprise applying a positive bias voltage (e.g., via bias voltage generator 302) to a first portion (e.g., flexible diaphragm 108) of a MEMS acoustic sensor (e.g., MEMS acoustic sensor or microphone element 102) comprising a diaphragm (e.g., flexible diaphragm 108) and a backplate (e.g., perforated backplate 106), at 802. In a non-limiting aspect, applying the positive bias voltage (e.g., via bias voltage generator 302) to the first portion (e.g., flexible diaphragm 108) of the MEMS acoustic sensor (e.g., MEMS acoustic sensor or microphone element 102) can comprise applying the positive bias voltage (e.g., via bias voltage generator 302) to the first portion (e.g., flexible diaphragm 108) with a positive charge pump of the ASIC (e.g., ASIC CMOS 104). In a further non-limiting aspect, applying the positive bias voltage (e.g., via bias voltage generator 302) to the first portion (e.g., flexible diaphragm 108) can comprise applying the positive bias voltage (e.g., via bias voltage generator 302) to at least a portion of the diaphragm (e.g., flexible diaphragm 108), as described herein. In yet another non-limiting aspect, applying the positive bias voltage (e.g., via bias voltage generator 302) to the first portion (e.g., flexible diaphragm 108) can comprise applying the positive voltage (e.g., via bias voltage generator 302) within the range of about 9 to about 19.5 Volts (V).

In a further non-limiting aspect, exemplary methods 800 can comprise maintaining a second portion (e.g., perforated backplate 106) of a MEMS acoustic sensor (e.g., MEMS acoustic sensor or microphone element 102) at a ground potential at 804. Exemplary methods 800 can further comprise, at 806, receiving, with a buffer amplifier (e.g., electronic circuitry 304 comprising a buffer amplifier) in an ASIC (e.g., ASIC CMOS 104) associated with the MEMS acoustic sensor (e.g., MEMS acoustic sensor or microphone element 102), a signal (e.g., one or more signals 306) from the first portion (e.g., flexible diaphragm 108) in response to a sensor signal change (e.g., a capacitance change) between the diaphragm (e.g., flexible diaphragm 108) and the backplate (e.g., perforated backplate 106) of the MEMS acoustic sensor (e.g., MEMS acoustic sensor or microphone element 102). As further described herein, the positive bias voltage (e.g., positive bias voltage via bias voltage generator 302) and the first portion (e.g., flexible diaphragm 108 or a portion thereof) can be operatively coupled to the buffer amplifier (e.g., electronic circuitry 304 comprising a buffer amplifier) via a capacitor (e.g., capacitor 310). In a further non-limiting aspect, receiving the signal (e.g., one or more signals 306) from the first portion (e.g., flexible diaphragm 108) can further comprise receiving the signal (e.g., one or more signals 306) from the at least the portion of the diaphragm (e.g., flexible diaphragm 108).

As a further non-limiting example, exemplary methods 800 can comprise creating an output signal (e.g., output signal 312) of the buffer amplifier (e.g., electronic circuitry 304 comprising a buffer amplifier) associated with sensor signal change (e.g., a capacitance change), for instance, at 808, as further described herein. For instance, in various exemplary implementations of methods 800, creating the output signal (e.g., output signal 312) can comprise creating the output signal (e.g., output signal 312) that matches polarity with sound pressure (e.g., acoustic waves or sound pressure 308) applied to the diaphragm (e.g., flexible diaphragm 108).

Figure 9:
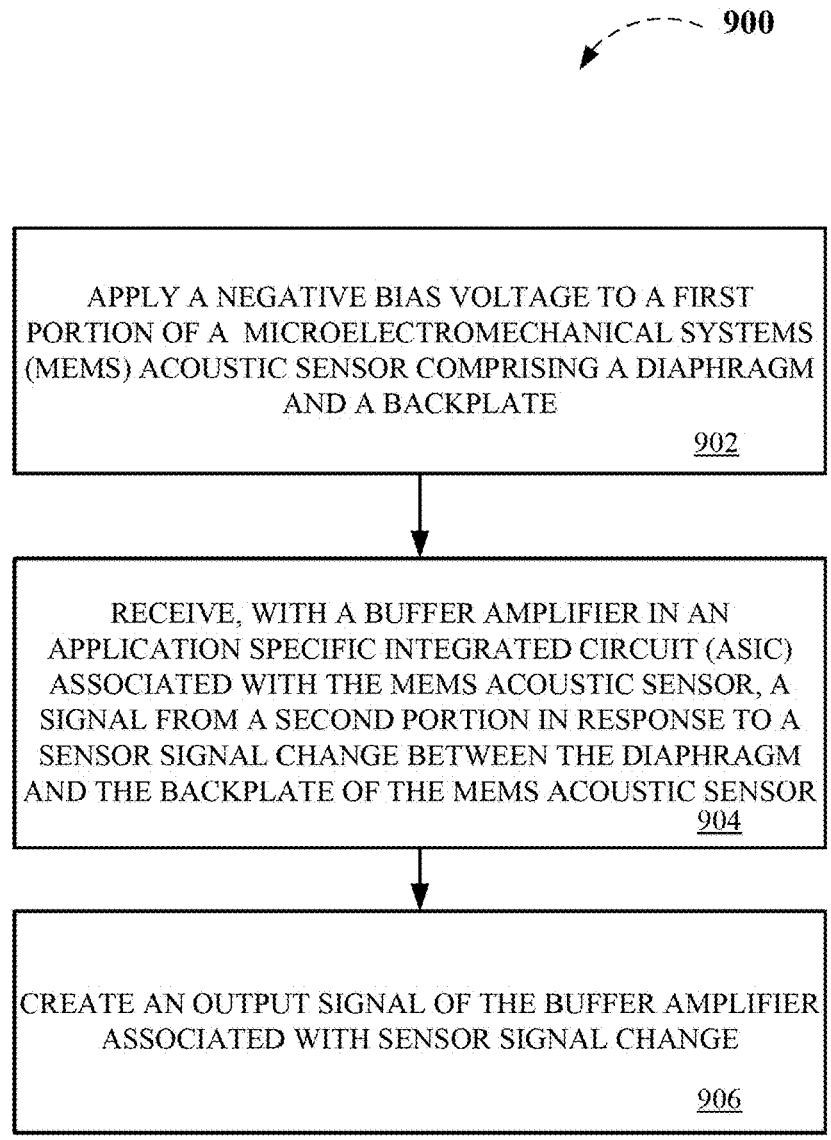
FIG. 9 depicts another exemplary flowchart of non-limiting methods associated with exemplary bias voltages for a MEMS sensor or microphone, according to other non-limiting aspects of the disclosed subject matter.

FIG. 9 depicts another exemplary flowchart of non-limiting methods 900 associated with exemplary bias voltages for a MEMS sensor or microphone, according to various non-limiting aspects of the disclosed subject matter. Accordingly, various non-limiting implementations of exemplary methods 900, as described herein, can comprise applying a negative bias voltage (e.g., via bias voltage generator 402) to a first portion (e.g., perforated backplate 106) of a MEMS acoustic sensor (e.g., MEMS acoustic sensor or microphone element 102) comprising a diaphragm (e.g., flexible diaphragm 108) and a backplate (e.g., perforated backplate 106), at 902. In a non-limiting aspect, applying the negative bias voltage (e.g., via bias voltage generator 402) to the first portion (e.g., perforated backplate 106) of the MEMS acoustic sensor (e.g., MEMS acoustic sensor or microphone element 102) can comprise applying the negative bias voltage (e.g., via bias voltage generator 402) to at least a portion of the backplate (e.g., perforated backplate 106) with a negative charge pump of the ASIC. In a further non-limiting aspect, applying the negative bias voltage (e.g., via bias voltage generator 402) to the first portion (e.g., perforated backplate 106) can comprise applying the negative bias voltage (e.g., via bias voltage generator 402) within the range of about −15 to about −7.5 Volts (V).

In yet another non-limiting aspect, exemplary methods 900 can comprise receiving, with a buffer amplifier (e.g., electronic circuitry 404 comprising a buffer amplifier) in an ASIC (e.g., ASIC CMOS 104) associated with the MEMS acoustic sensor (e.g., MEMS acoustic sensor or microphone element 102), a signal (e.g., one or more signals 406) from a second portion (e.g., flexible diaphragm 108) in response to a sensor signal change (e.g., a capacitance change) between the diaphragm (e.g., flexible diaphragm 108) and the backplate (e.g., perforated backplate 106) of the MEMS acoustic sensor (e.g., MEMS acoustic sensor or microphone element 102), at 904. In addition, exemplary methods 900 can further comprise creating an output signal (e.g., output signal 410) of the buffer amplifier (e.g., electronic circuitry 404 comprising a buffer amplifier) associated with sensor signal change (e.g., a capacitance change), at 906. In a further non-limiting aspect, creating the output signal (e.g., output signal 410) can comprise creating the output signal (e.g., output signal 410) that matches polarity with sound pressure (e.g., acoustic waves or sound pressure 408) applied to the diaphragm (e.g., flexible diaphragm 108).

Figure 10:
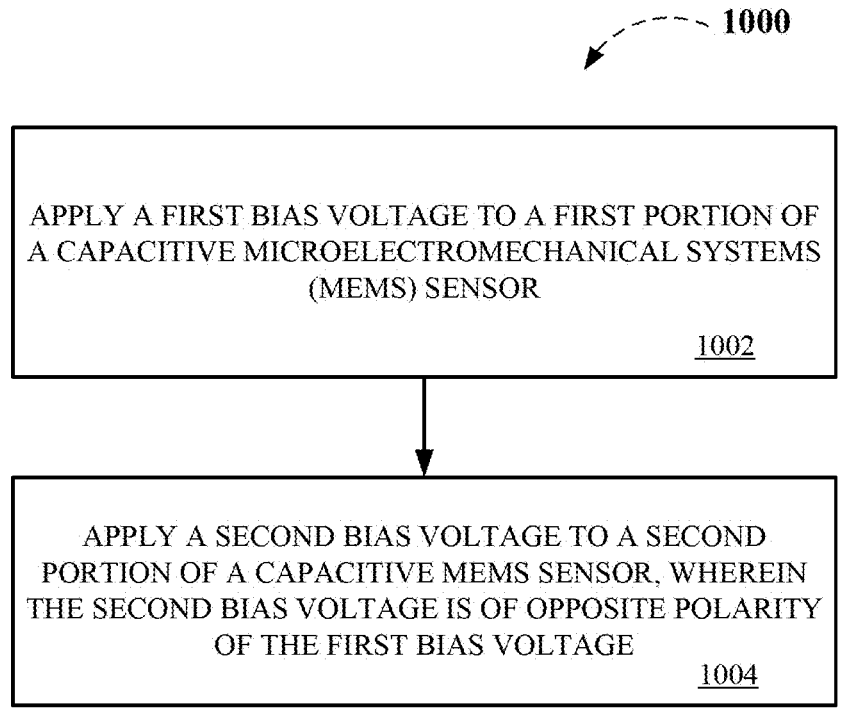
FIG. 10 depicts yet another exemplary flowchart of non-limiting methods associated with exemplary bias voltages for a MEMS sensor or microphone, according to various non-limiting aspects of the disclosed subject matter.

FIG. 10 depicts yet another exemplary flowchart of non-limiting methods 1000 associated with exemplary bias voltages for a MEMS sensor or microphone, according to various non-limiting aspects of the disclosed subject matter. Accordingly, various non-limiting implementations of exemplary methods 1000, as described herein, can comprise applying a first bias voltage (e.g., via bias voltage generator 502) to a first portion (e.g., one of the perforated backplate 106 or the flexible diaphragm 108) of a capacitive MEMS sensor (e.g., MEMS acoustic sensor or microphone element 102), at 1002. In a non-limiting aspect, applying the first bias voltage (e.g., via bias voltage generator 502) to the first portion (e.g., one of the perforated backplate 106 or the flexible diaphragm 108) of the capacitive MEMS sensor (e.g., MEMS acoustic sensor or microphone element 102) can comprise applying a positive voltage (e.g., via bias voltage generator 502) to a diaphragm (e.g., flexible diaphragm 108) of a MEMS microphone sensor (e.g., MEMS sensor device or microphone 100).

In a further non-limiting aspect, exemplary methods 1000 can comprise applying a second bias voltage (e.g., via bias voltage generator 512) to a second portion (e.g., the other of the perforated backplate 106 or the flexible diaphragm 108) of a capacitive MEMS sensor (e.g., MEMS acoustic sensor or microphone element 102), wherein the second bias voltage (e.g., via bias voltage generator 512) is of opposite polarity of the first bias voltage (e.g., via bias voltage generator 502), at 1004, as further described herein. In a further non-limiting aspect, applying the second bias voltage (e.g., via bias voltage generator 512) to the second portion (e.g., the other of the perforated backplate 106 or the flexible diaphragm 108) of the capacitive MEMS sensor (e.g., MEMS acoustic sensor or microphone element 102) can comprise applying a negative voltage (e.g., via bias voltage generator 512) to a backplate (e.g., perforated backplate 106) of the capacitive MEMS sensor (e.g., MEMS acoustic sensor or microphone element 102.

In other non-limiting implementations of exemplary methods 1000 (not shown), exemplary methods 1000 can comprise receiving, with a buffer amplifier (e.g., electronic circuitry 504 comprising a buffer amplifier) in an ASIC (e.g., ASIC CMOS 104) associated with the MEMS acoustic sensor (e.g., MEMS acoustic sensor or microphone element 102), a signal (e.g., one or more signals 506) from the first portion (e.g., flexible diaphragm 108) in response to a sensor signal change (e.g., a capacitance change) between the diaphragm (e.g., flexible diaphragm 108) and the backplate (e.g., perforated backplate 106) of the MEMS acoustic sensor (e.g., MEMS acoustic sensor or microphone element 102). As described above, an exemplary positive bias voltage (e.g., positive bias voltage via bias voltage generator 502) and the first portion (e.g., flexible diaphragm 108 or a portion thereof) can be operatively coupled to the buffer amplifier (e.g., electronic circuitry 504 comprising a buffer amplifier) via a capacitor (e.g., capacitor 510). In addition, further non-limiting implementations of exemplary methods 1000 (not shown) can comprise creating an output signal (e.g., output signal 514) of the buffer amplifier (e.g., electronic circuitry 504 comprising a buffer amplifier) associated with sensor signal change (e.g., a capacitance change).

In further non-limiting implementations of exemplary methods 1000 (not shown) exemplary methods 1000 can further comprise selectively varying one or more of the first bias voltage (e.g., via bias voltage generator 502) or the second bias voltage (e.g., via bias voltage generator 512) according to one or more of a set of modes based on power consumption, sound pressure level, predetermined noise performance of the capacitive MEMS sensor (e.g., MEMS acoustic sensor or microphone element 102), and/or other considerations, for example, as further described herein. In a non-limiting aspect, selectively varying the one or more of the first bias (e.g., via bias voltage generator 502) voltage or the second bias voltage (e.g., via bias voltage generator 512) according to the one or more of a set of modes can comprise varying the one or more of the first bias voltage (e.g., via bias voltage generator 502) or the second bias voltage (e.g., via bias voltage generator 512) between zero and a maximum voltage level. As further described herein, selectively varying the one or more of the first bias voltage (e.g., via bias voltage generator 502) or the second bias voltage (e.g., via bias voltage generator 512) can comprise selectively varying one or more of a negative bias voltage (e.g., via bias voltage generator 512) within the range of about −15 to about −7.5 Volts (V) or a positive bias voltage (e.g., via bias voltage generator 502) within the range of about 9 to about 19.5 Volts (V).

Figure 11:
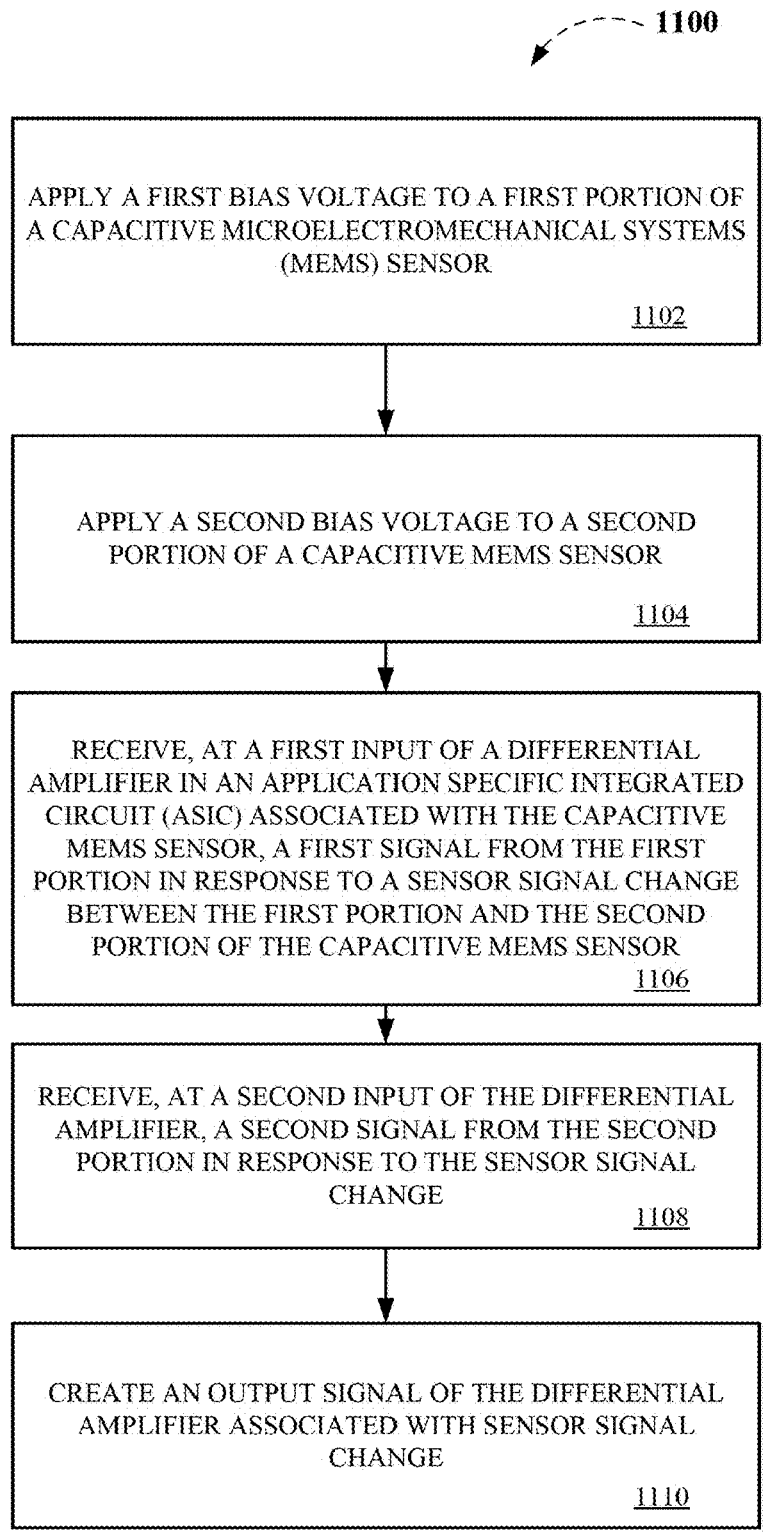
FIG. 11 depicts a further exemplary flowchart of non-limiting methods associated with exemplary bias voltages for a MEMS sensor or microphone, according to further non-limiting aspects of the disclosed subject matter.

FIG. 11 depicts a further exemplary flowchart of non-limiting methods 1100 associated with exemplary bias voltages for a MEMS sensor or microphone, according to further non-limiting aspects of the disclosed subject matter. Accordingly, various non-limiting implementations of exemplary methods 1100, as described herein, can comprise applying a first bias voltage (e.g., via bias voltage generator 602) to a first portion (e.g., one of the perforated backplate 106 or the flexible diaphragm 108) of a capacitive MEMS sensor (e.g., MEMS acoustic sensor or microphone element 102), at 1102. In a non-limiting aspect, applying the first bias voltage (e.g., via bias voltage generator 602) to the first portion (e.g., one of the perforated backplate 106 or the flexible diaphragm 108) of the capacitive MEMS sensor (e.g., MEMS acoustic sensor or microphone element 102) can comprise applying a positive voltage (e.g., via bias voltage generator 602) to a diaphragm (e.g., flexible diaphragm 108) of a MEMS microphone sensor (e.g., MEMS sensor device or microphone 100).

In further non-limiting implementations of exemplary methods 1100, at 1104, exemplary methods 1100 can further comprise applying a second bias voltage (e.g., via bias voltage generator 612) to a second portion (e.g., the other of the perforated backplate 106 or the flexible diaphragm 108) of a capacitive MEMS sensor (e.g., MEMS acoustic sensor or microphone element 102), for example, as further described herein. In a further non-limiting aspect, applying the second bias voltage (e.g., via bias voltage generator 612) to the second portion (e.g., the other of the perforated backplate 106 or the flexible diaphragm 108) of the capacitive MEMS sensor (e.g., MEMS acoustic sensor or microphone element 102) can comprise applying a negative voltage (e.g., via bias voltage generator 612) to a backplate (e.g., perforated backplate 106) of the capacitive MEMS sensor (e.g., MEMS acoustic sensor or microphone element 102). Thus, in a non-limiting aspect, applying the second bias voltage (e.g., via bias voltage generator 612) to the second portion (e.g., the other of the perforated backplate 106 or the flexible diaphragm 108) of the capacitive MEMS sensor (e.g., MEMS acoustic sensor or microphone element 102) can comprise applying the second bias voltage (e.g., via bias voltage generator 612) having opposite polarity of the first bias voltage (e.g., via bias voltage generator 602), as further described herein. In other non-limiting implementations of exemplary methods 1100, applying the second bias voltage (e.g., via bias voltage generator 612) to the second portion (e.g., the other of the perforated backplate 106 or the flexible diaphragm 108) of the capacitive MEMS sensor (e.g., MEMS acoustic sensor or microphone element 102) can comprise coupling the second portion (e.g., the other of the perforated backplate 106 or the flexible diaphragm 108) to one or more of a fixed DC potential or a high impedance connection to ground.

Exemplary methods 1100 can further comprise receiving, at a first input of a differential amplifier (e.g., electronic circuitry 604 comprising a differential amplifier) in an ASIC (e.g., ASIC CMOS 104) associated with the capacitive MEMS sensor (e.g., MEMS acoustic sensor or microphone element 102), a first signal (e.g., one or more first signals 606) from the first portion (e.g., one of the perforated backplate 106 or the flexible diaphragm 108) in response to a sensor signal change (e.g., a capacitance change) between the first portion (e.g., one of the perforated backplate 106 or the flexible diaphragm 108) and the second portion (e.g., the other of the perforated backplate 106 or the flexible diaphragm 108) of the capacitive MEMS sensor (e.g., MEMS acoustic sensor or microphone element 102), at 1106. At 1108, exemplary methods 1100 can further comprise receiving, at a second input of the differential amplifier (e.g., electronic circuitry 604 comprising a differential amplifier), a second signal (e.g., one or more second signals 616) from the second portion (e.g., the other of the perforated backplate 106 or the flexible diaphragm 108) in response to the sensor signal change (e.g., a capacitance change), in a further non-limiting aspect. In yet another non-limiting aspect, receiving at a first input or receiving at a second input can comprise receiving at the differential amplifier (e.g., electronic circuitry 604 comprising a differential amplifier) via a capacitor (e.g., one or more of capacitor 610 or 614), for example, as further described herein.

In other non-limiting implementations of exemplary methods 1100, at 1110, exemplary methods 1100 can further comprise creating an output signal (e.g., one or more of output signal 618 and output signal 620) of the differential amplifier (e.g., electronic circuitry 604 comprising a differential amplifier) associated with the sensor signal change (e.g., a capacitance change), for example, as further described herein. For instance, in non-limiting embodiments, creating the output signal (e.g., one or more of output signal 618 and output signal 620) associated with the sensor signal change (e.g., a capacitance change) can comprise creating the output signal (e.g., one or more of output signal 618 and output signal 620) based on a capacitance change associated with the capacitive MEMS sensor (e.g., MEMS acoustic sensor or microphone element 102). In a non-limiting aspect, creating the output signal (e.g., one or more of output signal 618 and output signal 620) can comprise creating one or more of a single output signal (e.g., output signal 618) or a differential output signal (e.g., differential output of ASIC CMOS 104 comprising output signal 618 and output signal 620) based on one or more of the first signal (e.g., one or more first signals 606) or the second signal (e.g., one or more second signals 616) that correspond to the sensor signal change (e.g., a capacitance change). In a further non-limiting aspect, creating the output signal (e.g., one or more of output signal 618 and output signal 620) can comprise rejecting common-mode signals between the first portion (e.g., one of the perforated backplate 106 or the flexible diaphragm 108) and the second portion (e.g., the other of the perforated backplate 106 or the flexible diaphragm 108), e.g., via electronic circuitry 604 comprising a differential amplifier, etc.

In further non-limiting implementations of exemplary methods 1100 (not shown) exemplary methods 1100 can further comprise selectively varying one or more of the first bias voltage (e.g., via bias voltage generator 602) or the second bias voltage (e.g., via bias voltage generator 612) according to one or more of a set of modes based on power consumption, sound pressure level, or predetermined noise performance of the capacitive MEMS sensor (e.g., MEMS acoustic sensor or microphone element 102), and/or other considerations, for example, as further described herein. As a non-limiting example, selectively varying the one or more of the first bias voltage (e.g., via bias voltage generator 602) or the second bias voltage (e.g., via bias voltage generator 612) according to the one or more of a set of modes can comprise varying the one or more of the first bias voltage (e.g., via bias voltage generator 602) or the second bias voltage (e.g., via bias voltage generator 612) between zero and a maximum voltage level. As further described herein, selectively varying the one or more of the first bias voltage (e.g., via bias voltage generator 602) or the second bias voltage (e.g., via bias voltage generator 612) can comprise selectively varying one or more of a negative bias voltage (e.g., via bias voltage generator 612) within the range of about −15 to about −7.5 Volts (V) or a positive bias voltage (e.g., via bias voltage generator 602) within the range of about 9 to about 19.5 Volts (V).

Figure 12:
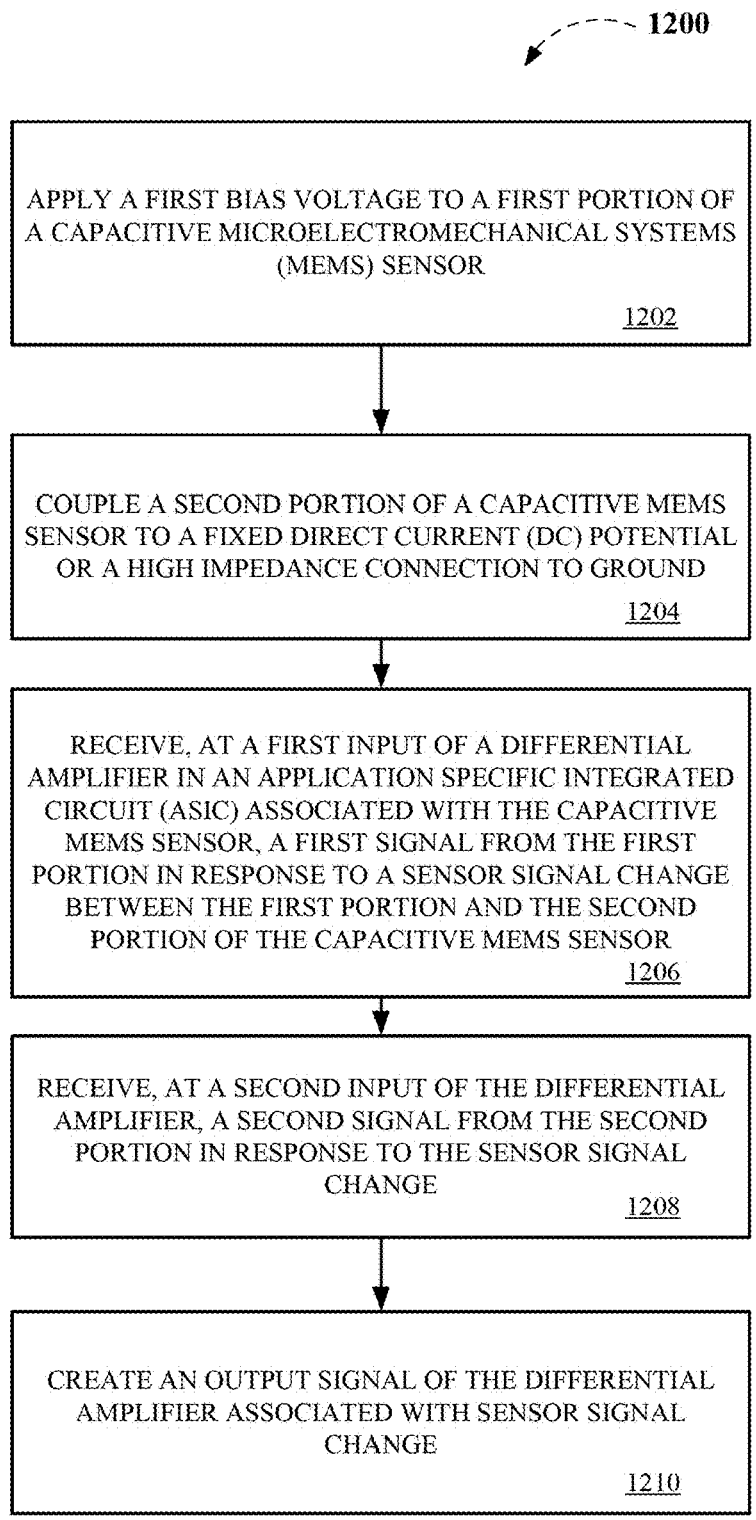
FIG. 12 depicts another exemplary flowchart of non-limiting methods associated with exemplary bias voltages for a MEMS sensor or microphone, according to other non-limiting aspects of the disclosed subject matter.

FIG. 12 depicts another exemplary flowchart of non-limiting methods 1200 associated with exemplary bias voltages for a MEMS sensor or microphone, according to other non-limiting aspects of the disclosed subject matter. Accordingly, various non-limiting implementations of exemplary methods 1200, as described herein, can comprise applying a first bias voltage (e.g., via bias voltage generator 702) to a first portion (e.g., Node 2 comprising perforated backplate 106 or flexible diaphragm 108) of a capacitive MEMS sensor (e.g., MEMS acoustic sensor or microphone element 102), at 1202. In a non-limiting aspect, applying the first bias voltage (e.g., via bias voltage generator 702) to the first portion (e.g., Node 2 comprising perforated backplate 106 or flexible diaphragm 108) of the capacitive MEMS sensor (e.g., MEMS acoustic sensor or microphone element 102) can comprise applying a positive voltage (e.g., via bias voltage generator 702) to a diaphragm (e.g., flexible diaphragm 108) of a MEMS microphone sensor (e.g., MEMS sensor device or microphone 100).

In further non-limiting implementations of exemplary methods 1200, at 1204, exemplary methods 1200 can further comprise coupling a second portion (e.g., Node 1 comprising the other of perforated backplate 106 or flexible diaphragm 108) of a capacitive MEMS sensor (e.g., MEMS acoustic sensor or microphone element 102) to a fixed direct current (dc) potential or a high impedance connection to ground.

Exemplary methods 1200 can further comprise receiving, at a first input of a differential amplifier (e.g., electronic circuitry 704 comprising a differential amplifier) in an ASIC (e.g., ASIC CMOS 104) associated with the capacitive MEMS sensor (e.g., MEMS acoustic sensor or microphone element 102), a first signal (e.g., one or more first signals 706) from the first portion (e.g., Node 2 comprising perforated backplate 106 or flexible diaphragm 108) in response to a sensor signal change (e.g., a capacitance change) between the first portion (e.g., Node 2 comprising perforated backplate 106 or flexible diaphragm 108) and the second portion (e.g., Node 1 comprising the other of perforated backplate 106 or flexible diaphragm 108) of the capacitive MEMS sensor (e.g., MEMS acoustic sensor or microphone element 102), at 1206. At 1208, exemplary methods 1200 can further comprise receiving, at a second input of the differential amplifier (e.g., electronic circuitry 704 comprising a differential amplifier), a second signal (e.g., one or more second signals 716) from the second portion (e.g., Node 1 comprising the other of perforated backplate 106 or flexible diaphragm 108) in response to the sensor signal change (e.g., a capacitance change), for example, as further described herein. In yet another non-limiting aspect, receiving at a first input or receiving at a second input can comprise receiving at the differential amplifier (e.g., electronic circuitry 704 comprising a differential amplifier) via a capacitor (e.g., one or more of capacitor 710 or 714), for example, as further described herein.

In other non-limiting implementations of exemplary methods 1200, at 1210, exemplary methods 1200 can further comprise creating an output signal (e.g., one or more of output signal 718 and output signal 720) of the differential amplifier (e.g., electronic circuitry 704 comprising a differential amplifier) associated with the sensor signal change (e.g., a capacitance change), for example, as further described herein. For instance, in non-limiting embodiments, creating the output signal (e.g., one or more of output signal 718 and output signal 720) associated with the sensor signal change (e.g., a capacitance change) can comprise creating the output signal (e.g., one or more of output signal 718 and output signal 720) based on a capacitance change associated with the capacitive MEMS sensor (e.g., MEMS acoustic sensor or microphone element 102). In a non-limiting aspect, creating the output signal (e.g., one or more of output signal 718 and output signal 720) can comprise creating one or more of a single output signal (e.g., output signal 718) or a differential output signal (e.g., differential output of ASIC CMOS 104 comprising output signal 718 and output signal 720) based on one or more of the first signal (e.g., one or more first signals 706) or the second signal (e.g., one or more second signals 716) that correspond to the sensor signal change (e.g., a capacitance change). In a further non-limiting aspect, creating the output signal (e.g., one or more of output signal 718 and output signal 720) can be based on rejecting common-mode signals between a first signal (e.g., one or more first signals 706) from the first portion (e.g., Node 2 comprising perforated backplate 106 or flexible diaphragm 108) and the second signal (e.g., one or more second signals 716) from the second portion (e.g., Node 1 comprising the other of perforated backplate 106 or flexible diaphragm 108), e.g., via electronic circuitry 704 comprising a differential amplifier, etc.

What has been described above includes examples of the embodiments of the disclosed subject matter. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in disclosed subject matter for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. Numerical data, such as voltages, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A microelectromechanical systems (MEMS) microphone, comprising:
a MEMS microphone element comprising a diaphragm and a backplate disposed in a microphone package; and
an application specific integrated circuit (ASIC) disposed in the microphone package comprising a first bias voltage generator and a second bias voltage generator, wherein the first bias voltage generator is operatively coupled to the diaphragm and configured to provide a first bias voltage to the diaphragm and the second bias voltage generator is operatively coupled to the backplate and configured to provide a second bias voltage to the backplate, and wherein the second bias voltage is of opposite polarity of the first bias voltage, wherein the ASIC is further configured to operate at least one of the first bias voltage generator or the second bias voltage generator in at least one of a set of modes based at least in part on power consumption, sound pressure level, or predetermined noise performance the MEMS microphone.

2. The MEMS microphone of claim 1, wherein the first bias voltage is of positive polarity and wherein the second bias voltage is of negative polarity.

3. The MEMS microphone of claim 1, wherein the first bias voltage generator comprises a positive charge pump, and wherein the second bias voltage generator comprises a negative charge pump.

4. The MEMS microphone of claim 1, wherein the ASIC further comprises electronic circuitry operatively coupled to the MEMS microphone element and configured to receive at least one signal that corresponds to a sound pressure applied to the diaphragm.

5. The MEMS microphone of claim 4, wherein the electronic circuitry comprises a buffer amplifier, and wherein an input of the buffer amplifier is operatively coupled to at least one of the diaphragm or the backplate via a capacitor.

6. The MEMS microphone of claim 4, wherein the electronic circuitry comprises a differential amplifier, wherein a first input of the differential amplifier is operatively coupled to the diaphragm via a first capacitor, and wherein a second input of the differential amplifier is operatively coupled to the backplate via a second capacitor.

7. The MEMS microphone of claim 6, wherein the differential amplifier is configured to provide a single output signal or a differential output signal based at least in part on the at least one signal that corresponds to the sound pressure applied to the diaphragm.

8. The MEMS microphone of claim 6, wherein the first bias voltage generator configured to provide the first bias voltage to the diaphragm or the second bias voltage generator configured to provide the second bias voltage to the backplate comprises coupling the backplate to at least one of a fixed direct current (DC) potential or a high impedance connection to ground.

9. The MEMS microphone of claim 1, wherein the at least one of the set of modes comprises variation of at least one voltage associated with the at least one of the first bias voltage generator or the second bias voltage generator between zero and a maximum voltage level associated with the at least one of the first bias voltage generator or the second bias voltage generator.

10. The MEMS microphone of claim 1, wherein the first bias voltage and the second bias voltage are configured such that they are substantially equal in magnitude or such that signals associated with the diaphragm and the backplate are not distorted.

11. A method, comprising:
applying a first bias voltage to a first portion of a capacitive microelectromechanical systems (MEMS) sensor;
applying a second bias voltage to a second portion of a capacitive MEMS sensor;
selectively varying at least one of the first bias voltage or the second bias voltage according to at least one of a set of modes based at least in part on power consumption, sound pressure level, or predetermined noise performance of the capacitive MEMS sensor;
receiving, at a first input of a differential amplifier in an application specific integrated circuit (ASIC) associated with the capacitive MEMS sensor, a first signal from the first portion in response to a sensor signal change between the first portion and the second portion of the capacitive MEMS sensor;
receiving, at a second input of the differential amplifier, a second signal from the second portion in response to the sensor signal change; and
creating an output signal of the differential amplifier associated with the sensor signal change.

12. The method of claim 11, wherein the creating the output signal associated with the sensor signal change comprises creating the output signal based at least in part on a capacitance change associated with the capacitive MEMS sensor.

13. The method of claim 11, wherein the applying the first bias voltage to the first portion of the capacitive MEMS sensor comprises applying a positive voltage to one of a diaphragm or a backplate of a MEMS microphone sensor.

14. The method of claim 13, wherein the applying the second bias voltage to the second portion of the capacitive MEMS sensor comprises applying a negative voltage to the other of the diaphragm or the backplate of the MEMS microphone sensor.

15. The method of claim 11, wherein the applying the second bias voltage to the second portion of the capacitive MEMS sensor comprises coupling the second portion to at least one of a fixed direct current (DC) potential or a high impedance connection to ground.

16. The method of claim 11, wherein the creating the output signal of the differential amplifier comprises creating at least one of a single output signal or a differential output signal based at least in part on at least one of the first signal or the second signal that corresponds to the sensor signal change.

17. The method of claim 11, wherein the creating the output signal comprises creating the output signal based on rejecting common-mode signals between the first portion and the second portion.

18. The method of claim 11, wherein at least one of the receiving at a first input or receiving at a second input comprises receiving at the differential amplifier via a capacitor.

19. The method of claim 11, wherein the selectively varying the at least one of the first bias voltage or the second bias voltage according to the at least one of a set of modes comprises varying the at least one of the first bias voltage or the second bias voltage between zero and a maximum voltage level.

* * * * *